US011171048B2

(12) United States Patent
Morgan-Jones et al.

(10) Patent No.: US 11,171,048 B2
(45) Date of Patent: Nov. 9, 2021

(54) ADAPTIVE ENDPOINT DETECTION FOR AUTOMATED DELAYERING OF SEMICONDUCTOR SAMPLES

(71) Applicant: FEI Company, Hillsboro, OR (US)

(72) Inventors: Sean O. Morgan-Jones, Portland, OR (US); Sophia E. Weeks, Portland, OR (US); Peter D. Carleson, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 15 days.

(21) Appl. No.: 16/816,695

(22) Filed: Mar. 12, 2020

(65) Prior Publication Data

US 2021/0287938 A1    Sep. 16, 2021

(51) Int. Cl.
*H01L 21/768* (2006.01)
*H01L 21/02* (2006.01)
*G03F 1/84* (2012.01)

(52) U.S. Cl.
CPC .......... *H01L 21/76865* (2013.01); *G03F 1/84* (2013.01); *H01L 21/02019* (2013.01)

(58) Field of Classification Search
CPC ......... H01L 21/76865; H01L 21/02019; H01L 21/67253; H01L 21/31127; H01L 21/31116; H01L 21/31138; H01L 21/32131; H01L 21/31111; G03F 1/84; G01N 21/68; H01J 37/32009
See application file for complete search history.

(56) References Cited

U.S. PATENT DOCUMENTS

2004/0082176 A1* 4/2004 Kane ................. H01L 21/31111
                                                              438/690
2019/0385876 A1* 12/2019 Tanaka ................ H01L 21/3065

OTHER PUBLICATIONS

Hakala et al., "Automated gas-enhanced PFIB surface preparation enabled metrology and statistical analysis of 3D NAND devices", 45th International Symposium for Testing and Failure Analysis, 5 pages (Nov. 2019).

* cited by examiner

*Primary Examiner* — John P. Dulka
(74) *Attorney, Agent, or Firm* — Klarquist Sparkman, LLP

(57) ABSTRACT

Adaptive endpoint detection is applied to delayering of a multi-layer sample utilizing a combination of dynamic and predetermined parameters. Tuned predetermined parameters, varying between layers of the sample, allow automated operation across multiple sites of a device. A semiconductor logic device is described, having a zone of thick metal layers and a zone of thin metal layers. The described techniques can be integrated with analysis operations and can be applied across a wide range of device types and manufacturing processes.

20 Claims, 12 Drawing Sheets

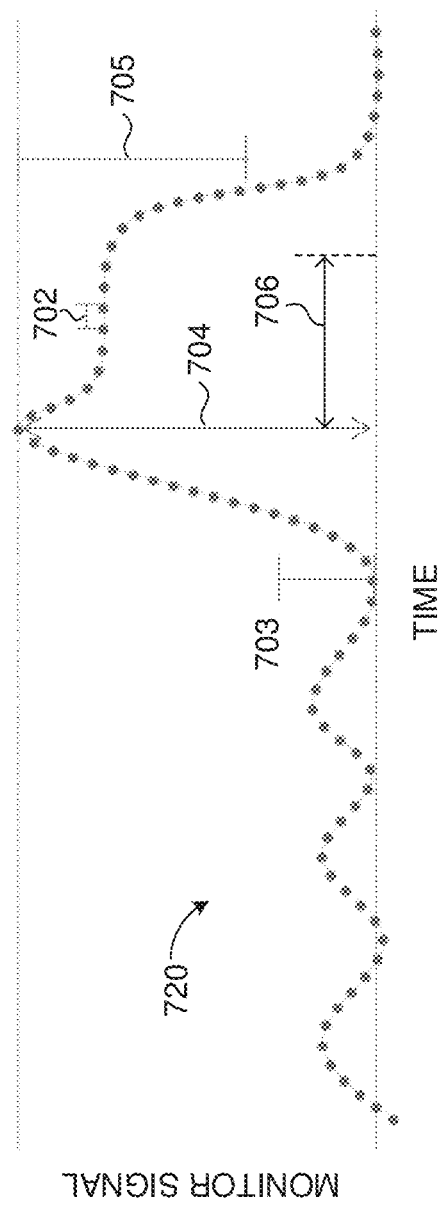
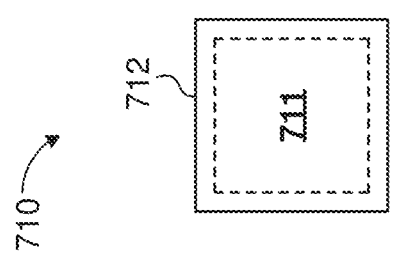
FIG. 7A
FIG. 7B

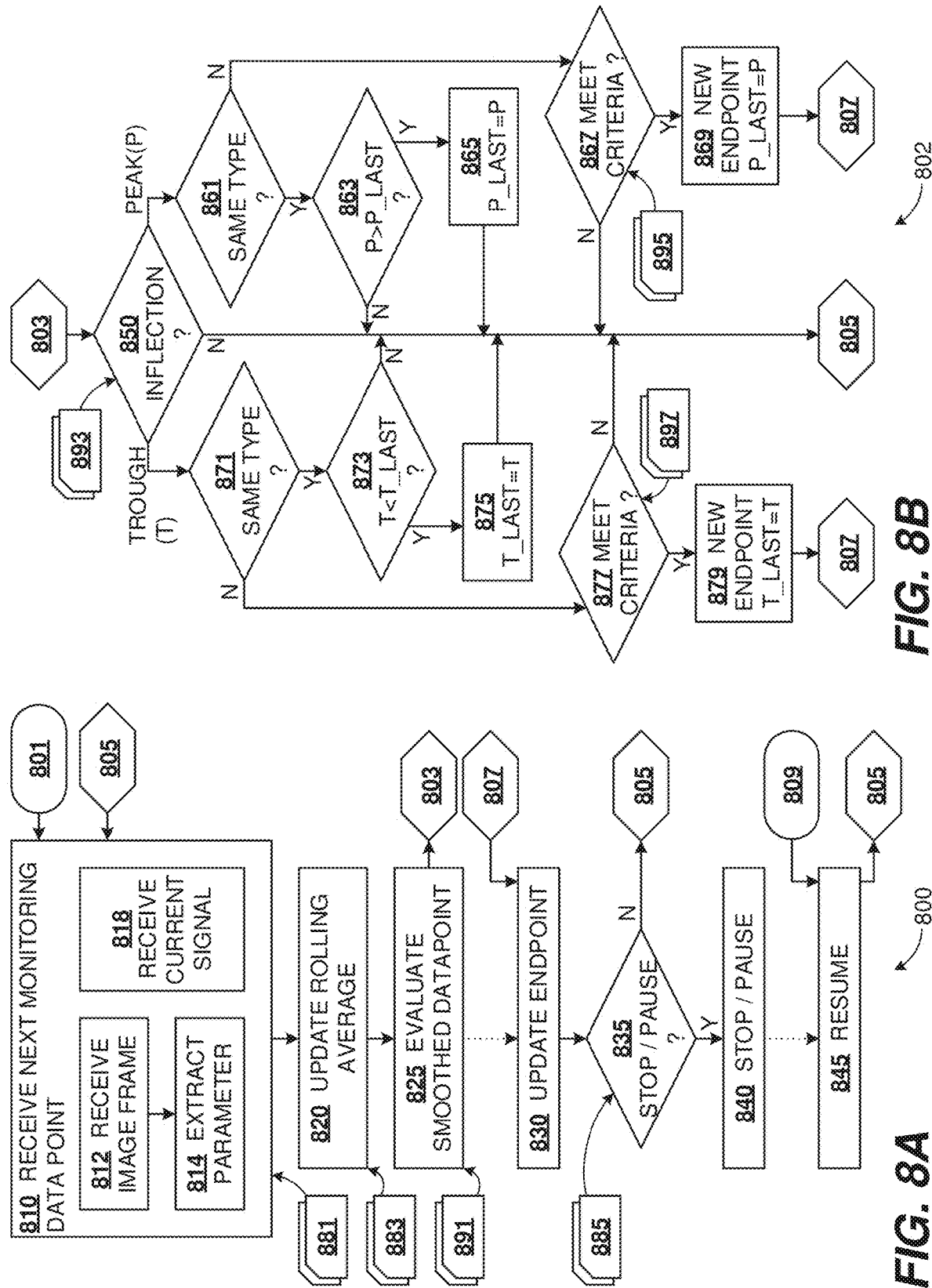

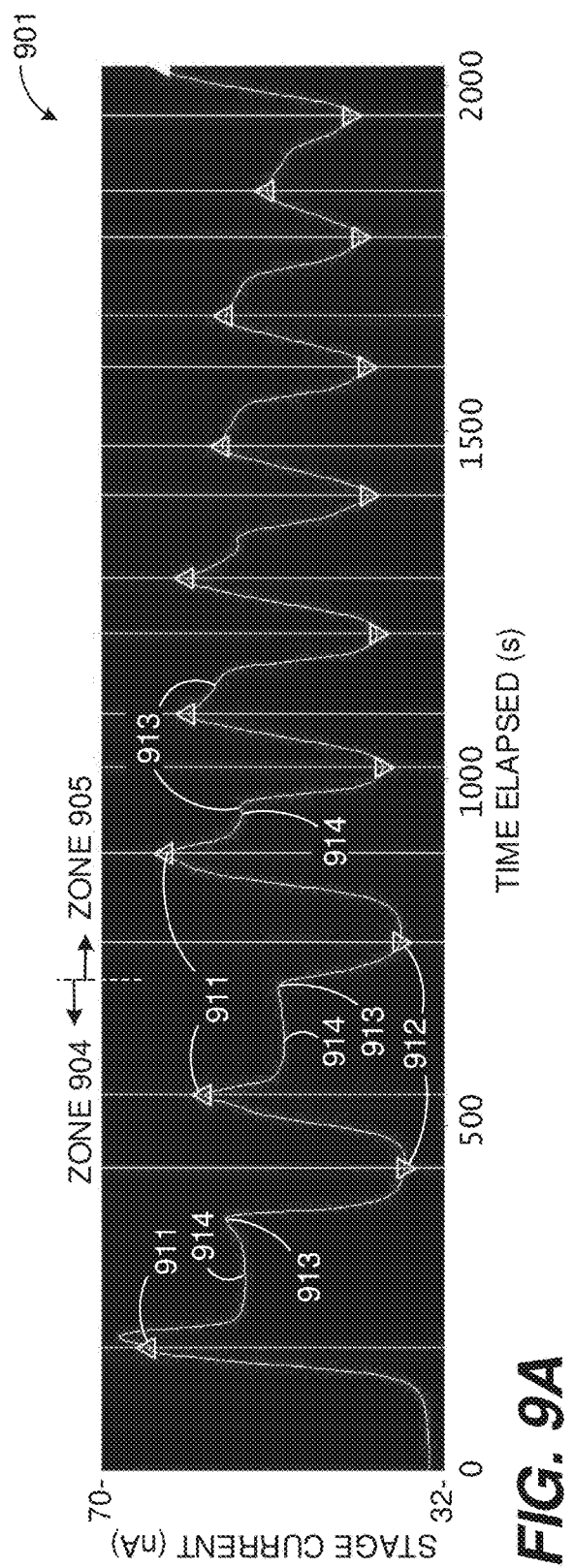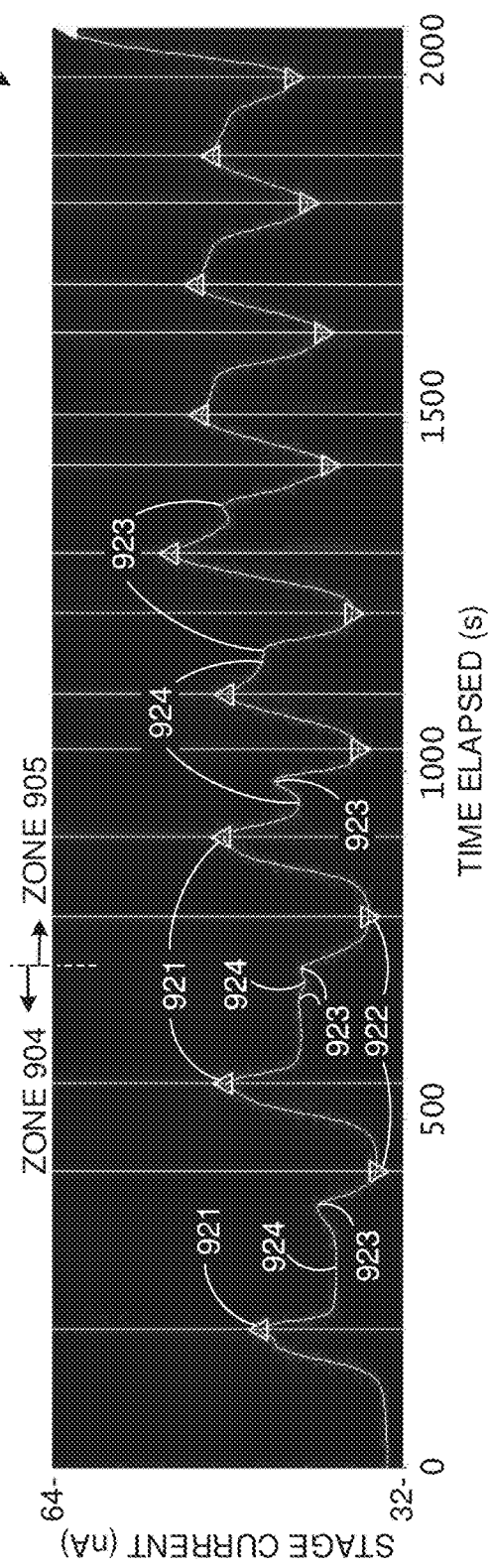
FIG. 9A
FIG. 9B

ADAPTIVE ENDPOINT DETECTION FOR AUTOMATED DELAYERING OF SEMICONDUCTOR SAMPLES

FIELD

The disclosure pertains to sample preparation for evaluation of multilayer structures.

BACKGROUND

Delayering of semiconductor devices plays an important role in process characterization and maintenance. It is often desirable to etch a device up to an endpoint at a particular layer and perform analysis or metrology at that layer. However, there can be significant variations in monitor signals between device classes, between different products of a class, between different samples of a product, and between different sites on a single sample. Accordingly, automation of the delayering process has been challenging, and significant operator input is often required. This can be a particular issue for multi-shift production lines, where operators with the requisite skills may not be available on all shifts. Accordingly, there remains a need for improved technology to automate the delayering process.

SUMMARY

Methods and apparatus are disclosed for preparation and execution of automated delayering of a multi-layer sample.

In a first aspect, the disclosed technology can be implemented as a system incorporating an etcher, computer-readable media storing program instructions, and one or more hardware processors, with coupled memory, configured to execute the program instructions and cause the apparatus to perform the following operations. Successive layers of a sample are delayered. The delayering of each layer includes controlling the delayering with a respective set of predetermined parameters, and detecting a respective endpoint using adaptive endpoint detection. The layers include first and second layers of a given layer type which are controlled by different sets of the predetermined parameters.

In some examples, a common first set of the predetermined parameters can be used for controlling the delayering of a first contiguous group of the layers, including the first layer, and a common second set of the predetermined parameters can be used for the controlling the delayering of a second contiguous group of the layers, including the second layer. The common first set of the predetermined parameters can include one or more beam etch parameters and one or more adaptive endpoint detection parameters. Delayering of the first and second layers can be performed with distinct values for at least one of the adaptive endpoint detection parameters, such as distinct values of: an initial value of an endpoint detection threshold; a coefficient for dynamically updating the endpoint detection threshold; an endpoint spacing threshold; or a parameter characterizing a region of interest in an image of the sample. Delayering the first and second layers can be performed with distinct values for at least one of the beam etch parameters, such as distinct values of: a voltage; a current; a focus diameter; an etching area; a dwell time; a scanning speed; or a rastering pitch.

In additional examples, the operations can also include pausing the delayering upon detection of a given layer's endpoint, and resuming the delayering upon receipt of a control signal indicating completion of an analytic procedure on the sample. The delayering can be performed at first and second sites of the sample, with identical sets of predetermined parameters for delayering at the first and second sites. In some examples, the operations can include receiving a signal indicating a measure of electrical current from the sample, with endpoint detection being based on the signal. In other examples, the operations can include obtaining a sequence of image parameters of respective images of the sample, with endpoint detection being based on the sequence of image parameters.

In further examples, a given endpoint can be determined as a peak in a process signal from the semiconductor sample during the delayering. Another endpoint can be determined as a trough in the process signal.

In some examples, the etcher can be configured to generate a focused ion beam (FIB). The system can also include a scanning electron microscope (SEM).

In another aspect, the disclosed technology can be implemented as a method. Delayering of successive layers of a semiconductor device can be controlled with respective sets of predetermined parameters. Endpoints of the successive layers are determined using adaptive endpoint detection. The layers include first and second layers of a same layer type, delayering of which are controlled by distinct sets of the predetermined parameters.

In some examples, the semiconductor device can be a first semiconductor device and the method can include determining adaptive endpoint detection parameters, among the predetermined parameters, prior to delayering, from one or more trials on a second semiconductor device. The semiconductor device can be a logic device and the layers can include an alternating stack of metal layers and via layers, and an active layer, the metal layers being a metal layer type and the via layers being a via layer type. The alternating stack can include a first group of layers above a second group of layers. The first layer can be a metal layers of the first group, and the second layer can be a metal layer of the second group. A minimum thickness of the metal layers of the first group can exceed a maximum thickness of the metal layers of the second group.

In a further aspect, the disclosed technologies can be implemented as computer-readable storage media storing instructions which, when executed by one or more hardware processors, cause the one or more hardware processors to perform the following operations. An etcher is controlled, using a first set of predetermined parameters, to delayer a first zone of a semiconductor device. The first zone includes two or more contiguous layers of the semiconductor device. An endpoint of a first layer in the first zone is determined using adaptive endpoint detection, following which delayering switches from the first set of predetermined parameters to a different second set of predetermined parameters. The etcher is controlled, using the second set of predetermined parameters, to delayer at least one additional layer of the semiconductor device.

The foregoing and other objects, features, and advantages of the disclosed technologies will become more apparent from the following detailed description, which proceeds with reference to the accompanying figures.

BRIEF DESCRIPTION OF THE DRAWINGS

FIGS. 7A-7B illustrate example predetermined adaptive endpoint detection parameters, according to the disclosed technologies.

FIGS. 8A-8B are flowcharts of additional example methods for delayering a sample, according to the disclosed technologies.

FIGS. 9A-9B are graphs of example monitor signals obtained during delayering two sites on a common semiconductor device sample, according to the disclosed technologies.

DETAILED DESCRIPTION

Terminology

Figure 1:
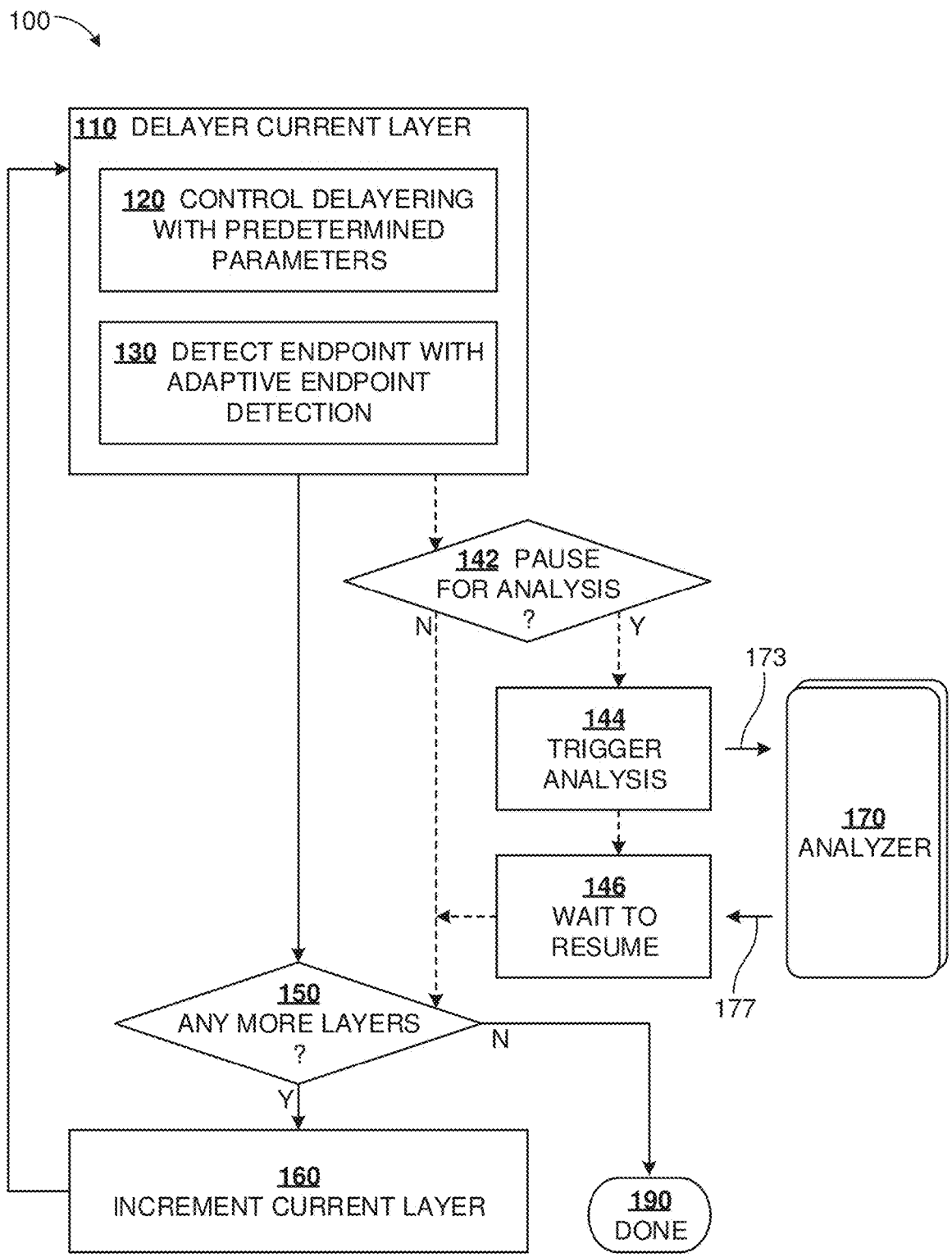
FIG. 1 is a flowchart of a first example automated method for delayering successive layers of a sample, according to the disclosed technologies.

The term "active layer" or "active contact layer" refers to a layer or group of sub-layers of a device in which contacts to active semiconductor structures (e.g. diodes; transistors, including bipolar or field-effect transistors; memory cells; or optoelectronic devices) are formed. The active layer can have a mask pattern or can have portions with different doping characteristics. The active layer can incorporate electrodes or contacts to active structures. A layer is active irrespective of whether the semiconductor device is powered on or operational.

The term "adaptive" refers to a method, system, or technology that can autonomously adjust its operational characteristics in response to changing input or environmental conditions. For an adaptive entity having one or more inputs and one or more outputs, the output(s) for given input(s) can vary according to a state of the adaptive entity. Further, the input(s) required to obtain given output(s) can vary according to the state of the adaptive entity.

The term "analysis" and "analyzer" pertain to operations to characterize a sample, and equipment or instrumentation for performing such operations. Analysis can include various forms of imaging, or probe measurements of electrical properties, or non-contact optical measurements. During a delayering procedure, analysis can be performed at one or more layers exposed through delayering, before proceeding to successive layers. Some analysis can require preparation of the exposed surface, e.g. by polishing, prior to performing the analysis. Some analysis can require that etching action be paused for analysis to be performed, while other analytic techniques can be conducted on-the-fly during an etching action.

The term "base layer" refers to a lowest layer of interest in a sample. In samples that are electronic structures, the base layer can be an electrically conducting layer or an active layer.

The term "delayer" refers to a subtractive process for removing one or more layers of a multi-layer sample, for example by etching (including milling).

The term "endpoint" refers to a target layer or target layer surface that is to be reached in a delayering process or an intermediate layer or intermediate layer surface that is reached in delayering to the target layer. In an automated delayering procedure, reaching an endpoint can be detected automatically based on monitoring one or more signals from the sample or the etching apparatus. Etching can stop or pause at a given endpoint, however that is not a requirement. In some examples, an endpoint can be detected, logged, and the delayering can proceed without pausing. The delayering can pause or stop when an endpoint of a predetermined target layer is reached. In some examples, endpoints can be labeled Peak or Trough according to whether the endpoints correspond to positive or negative excursions of a monitoring signal, respectively. However, this is not a requirement, and other endpoints in between peaks and troughs, or based on signal slope, can also be used.

The term "etch" refers to a subtractive process for removal of material from a sample. Etching can be performed by a variety of techniques including, without limitation, ion beam milling, chemical etch (in liquid or gas phase), plasma etch, mechanical milling, grinding, or chemical-mechanical polishing, or by a combination of techniques. For example, ion beam assisted gas etching can be used in some embodiments of the disclosed technology. Commonly, etching can be performed according to a pattern, however this is not a requirement. Patterning can be achieved through the use of a mask, or by e.g. scanning an ion beam to cover the desired pattern.

The term "etch rate" or "etching rate" refers to a rate at which material is removed from a surface by an etching process, and can be measured in nm/s.

An "etching procedure" can include at least one period of time (dubbed an "etching action") over which sample material is continuously being removed, as well as optional quiescent periods, e.g. for purging a gas environment, recharging a beam source, retrace of a raster scan, or an analytic measurement on the sample.

The term "etch stop" refers to a sample location in an etching process at which etching rate drops, as at a particular layer of a sample. An etch stop can aid endpoint detection, however the disclosed technologies can be applied without reliance on any etch stop.

The term "focused ion beam" (FIB) refers to a beam of ions arranged to focus at a spot on a surface. A FIB can be used for analysis, deposition, or removal of material at the focus spot. Commonly, a FIB comprises positive elemental ions, such as Xe+ or Ga+, however these are not requirements. Ion beam species such as Ga+ can be sourced from e.g. a liquid metal ion source (LMIS), while other ion beam species such as Xe+ can be produced in a plasma. A FIB produced with a plasma source can be termed a plasma focused ion beam (PFIB). Commonly, a FIB can be scanned over a pattern on a surface for an analysis, deposition, or removal procedure.

An "inflection" is a sequence of three or more monitoring datapoints (such as d1, d2, d3) in which d2−d1 and d3−d2 have opposite sign. A peak inflection occurs when d2 is greater than both d1 and d3, while a trough inflection occurs when d2 is less than both d1 and d3. In some examples, an inflection can be detected over a larger number of consecutive datapoints (such as $d_1, d_2, \ldots d_{N-1}, d_N$), where intermediate points are generally constant. That is, $d_2-d_1$ and $d_N-d_{N-1}$ can have opposite sign and a magnitude exceeding a threshold (which can be zero), while for K=3 to N−1, $d_K-d_{K-1}$ does not exceed the threshold.

The term "layer" refers to a region of a sample having a transverse extent parallel to a surface of the sample, at some depth, with some material characteristic to distinguish the layer from material at greater and/or lesser depths. Layers can be of various types. Semiconductors can have metal, via, and active layer types, while other classes of devices can have additional or different layer types. Some layers are substantially homogeneous, such as a metallization ground plane, while other layers are heterogeneous to varying degrees. For example, a "metal layer" can have at least 5%, 10%, 20%, or 50% of its transverse area formed by metal, including metal traces having lengthwise extents in one or more directions as well as metal islands, with insulating material separating neighboring metal traces or islands. For example, a "via layer" can have conductive pillars distributed in primarily insulating material, with less than 5%, 10%, 20%, or 50% of the layer's transverse area formed by the conductive material. For example, an "active layer" can have a mask pattern or can have portions with different doping characteristics and electrodes or bodies of active devices occupying a small or large fraction of the layer's transverse area; nevertheless, the active layer can be readily distinguished from other layers above or below. A layer can be identified by its largest material constituent by area or volume; alternatively, a layer can be identified functionally, such as a photonic waveguide layer or a metallization layer, even when such layer predominantly contains non-functional or inert material. A "zone" of layers can be a set of two or more contiguous layers (i.e. successive layers with no gaps) within a device. To illustrate the layers from Metal-1 to Metal-3 (including Metal-2 and via layers or any other layers in between) can form a zone. A "group" of layers can be a set of two or more layers which need not be contiguous (i.e. the group of layers can have one or more gaps). To illustrate, the layers Via-1, Via-2, and Via-3 can form a group (e.g. the group can exclude intervening layers Metal-2, Metal-3). A zone of layers is a group of layers with no gaps.

The term "mill" refers to a material removal or etching process over a path that is guided by movement or scanning of a milling tool, relative to a sample being milled, over that path. Thus, etching with a focused ion beam (FIB) can be regarded as milling, while diffuse chemical etching may not be considered as milling. Because ion beam assisted chemical etching can be site specific at the location of the ion beam, it too can be regarded as milling.

The term "monitoring signal" refers to a signal indicative of progress in a delayering procedure. The signal can be received from a sample being delayered, an apparatus with which delayering is being performed, or instrumentation coupled to the sample or the apparatus. A device coupled to receive or provide a monitoring signal is dubbed a "monitor."

The term "parameter" refers to a quantity that can have a specified value. While parameters often have numerical values, this is not a requirement. A parameter can have atomic values such as numerical, Boolean, or string; or more complex values organized as a data structure such as a list, a table, or a record. In the context of delayering, parameters can be classified as predetermined or dynamic. A "predetermined parameter" can have a value specified prior to commencement of a delayering procedure or an etching action, and whose value can remain unchanged for the duration of the delayering procedure or etching action. Examples of predetermined parameters can include beam voltage, layer count, or a coefficient for determining a threshold. A "dynamic parameter" can have a value which varies during the delayering procedure or etching action. Particularly, the value of a dynamic parameter can vary based on one or more monitoring signals observed during delayering or etching. A dynamic parameter can be initialized to the value of a predetermined parameter. A "set of parameters" denotes the parameters together with their associated values, so that two sets of parameters are distinct if a common parameter has different values in the two sets.

The term "region of interest" (ROI) refers to a portion of a sample device to be examined. In the disclosed technologies, the ROI can be examined by a delayering process, where material is removed starting at a top surface, down through successive layers of the sample device. An ROI can be shown as an area on a surface of the sample device, and can extend below the surface to some depth. Commonly, the depth can be less (often, significantly less) than a transverse extent of the ROI, however this is not a requirement: in some examples an ROI can have small transverse extent in at least one transverse direction, with larger depth. An ROI can be shown as an area on an exposed layer of the sample after some delayering, and can be limited to the depth or thickness of the exposed layer, or can be limited to the surface of the exposed layer. The term ROI does not refer to any human interest.

A "sample" or "sample device" is an article to be processed according to the disclosed technologies. Common samples are multilayer electronic structures, such as semiconductor logic devices. Many other microelectronic devices, electro-optical devices, or photonic devices can also be processed as described herein. Still further, certain examples of the disclosed technology can be applied to mineral samples, biological samples, chemical samples, or forensic samples.

The term "target layer" refers to a layer of a sample at which a delayering procedure can be paused or halted, for example to perform an analytic procedure on the target layer.

The term "working surface" refers to an evolving active surface on which process operations are performed. The working surface can be at or within a layer dubbed the "working layer." For example, in a delayering process, the working surface can descend through a sample as material is removed. Conversely, in a coating or epitaxial growth process, the working surface can rise above an original surface as material is added.

The terms "top," "bottom," "up," "down," "above," "below" and the like are used for convenience, with respect to a common configuration in which a top surface of a sample is processed, e.g. by ion milling, downward to increasing depths. One of ordinary skill will understand from this disclosure that a choice of actual orientation can be varied without departing from the scope of the disclosed technologies.

Overview

Delayering of semiconductor devices plays an important role in process characterization and maintenance. It is often desirable to etch a device up to an endpoint at a particular layer and perform analysis or metrology at that layer. However, prior attempts to detect endpoints automatically have been unable to cope with the wide range of signal shapes encountered in practice. Monitoring signal waveforms can vary from layer to layer, even for a same layer type, or from site to site on a device. Signal waveforms or layer stacks can differ between different products fabricated on a common process. Products of different classes (e.g. various memory types, such as DRAM, flash, SRAM; application specific integrated circuit (ASIC); processor; field programmable gate array (FPGA); optoelectronics, including image sensors, displays, semiconductor lasers, or planar lightwave circuits; wireless communication devices; or monolithic microwave integrated circuit (MMIC)) or fabricated on different processes can also have widely varying signal patterns.

The disclosed technologies provide a uniform methodology for configuring a delayering process and operating the configured delayering process in automated or unattended fashion on large numbers of samples or multiple sites within a given sample device.

In brief, and as described further herein, a sample cross-section can be used to formulate a delayering plan, optionally including analysis at one or more layers. Tuned parameters can be determined prior to delayering a particular device, and can be used to control the delayering at successive layers. The predetermined tuned parameters can include parameters for controlling the etching action (in examples, beam etch parameters), or other parameters for controlling an endpoint detection procedure (in examples, adaptive endpoint detection parameters). Detected endpoints can be used to pause the etching for layer analysis; to select a different set of predetermined parameters for a subsequent layer; or to monitor the progress of delayering down through the device. The predetermined tuned parameters can be obtained from libraries of parameters, organized by device types, process, and so forth; or can be determined empirically by one or more trial delayering procedures executed on a test device.

An adaptive endpoint detection technique can respond to variations in a monitoring signal over the course of delayering multiple device layers. That is, dynamic variation of the signal (e.g. varying parameters such as amplitude, period, rise time, fall time, or characteristics of particular waveform features) can lead to dynamic variation of thresholds or target conditions at which the technique identifies an endpoint. However, these thresholds or target conditions can also be dependent on predetermined parameters as described further herein. The inventors have found that suitable tuning of the predetermined parameters, controlling an adaptive endpoint detection procedure, can lead to superior performance across a wide range of devices and layer stacks. It can also be advantageous to control the etching action (e.g. by setting the beam voltage to a predetermined value) with additional predetermined parameters. Particularly, the predetermined parameters can be varied between groups of layers (e.g. different parameters for a first zone having thick metal layers, and for a second zone having thin metal layers) or between individual layers, even between two layers of a given type (e.g. two metal layers).

First Example Method

FIG. 1 is a flowchart 100 of a first automated method for delayering successive layers of a sample. A variation of the method, which integrates analysis into the process flow, is indicated with dashed lines.

At process block 110, a current working layer can be delayered. As an illustration, the current working layer can be the third metal layer (Metal-3) counting from the top of a semiconductor device sample. Within process block 110, the delayering can be controlled by predetermined parameters, as indicated by block 120. Delayering can be performed by etching with a raster scanned FIB or by any other techniques as described herein. Concurrently, an endpoint can be detected at process block 130, using adaptive endpoint detection. The detecting can occur at the time when it is determined that the endpoint has been reached, while adaptive endpoint detection can operate before, during, and after this time. The predetermined parameters can include parameters associated with an etching action (e.g. beam voltage, beam current, focus diameter of the beam, an area over which etching is performed, a dwell time for holding the beam steady at a given point within the etching area, a scan speed of an etching beam across a working surface of the sample, or a rastering pitch indicating a transverse distance between neighboring dwell locations), or can include parameters associated with adaptive endpoint detection (e.g. a multiplicative coefficient to set a threshold for endpoint detection).

Upon detection of the endpoint, the method can continue to decision block 150, where a determination is made whether any further layers are to be delayered. If not, the method follows the N branch from block 150 to termination block 190, and the method can be complete. However, if additional layers remain to be delayered, the method can proceed via the Y branch to block 160, where the layer is incremented (with count increasing going down into the sample), and then returns to block 110 to delayer the next layer, which could be the third via layer (Via-3), now the current layer.

While successive layers are delayered using predetermined parameters, the predetermined parameters can be varied between layers. In some examples, a first zone having thick layers (e.g. thick metal or thick via layers) can be delayered using a first set of predetermined parameters, while a second zone having thin layers (e.g. thin metal or thin via layers) can be delayered using a second set of predetermined parameters, having at least one predetermined parameter different from the first set. In further examples, first and second layers of a given layer type (e.g. both metal layers) can be delayered with distinct sets of controlling predetermined parameters. The first layer can be a thick metal layer in the first zone and the second layer can be a thin metal layer in the second zone. In additional examples, adjacent layers of different types (e.g. a metal layer and an adjacent via layer) can be delayered with different parameters. In still further examples, one or more of the predetermined parameters can be gradually varied over a continuous range of delayered layers, such that no two of the delayered layers are controlled by exactly the same predetermined parameters.

In some examples, analysis can be incorporated into the method at prescribed endpoints. To illustrate, one or more analysis operations can be triggered at every metal layer; at a number of desired layers, such as Via-3, Metal-4, and Via-7; or at the Active layer of a sample semiconductor device. Turning to the dashed lines in flowchart 100, when an endpoint is detected at block 130, the method variation follows a dashed line to decision block 142 instead of going directly to decision block 150. At block 142, a determination can be made whether the current endpoint is flagged for any analysis procedure. If not, the method follows the N branch from block 142 to block 150, and proceeds as described above. However, if an analysis procedure is specified, the method follows the Y branch to process block 144, where the analysis procedure can be triggered. The trigger signal 173 can be directed to analyzer 170 as indicated, and the method can proceed to block 146 to wait for analysis to complete. When analysis is complete, the analyzer 170 can indicate completion via signal 177, which completes the wait at block 146, allowing the method to proceed to decision block 150 as indicated by dashed lines, to continue as described herein. In variations, more than one analyzer 170 can perform more than one analyses on the sample, or different analyses can be performed on different layers of the sample, i.e. at different endpoints of the delayering procedure.

Example Apparatus

Figure 2:
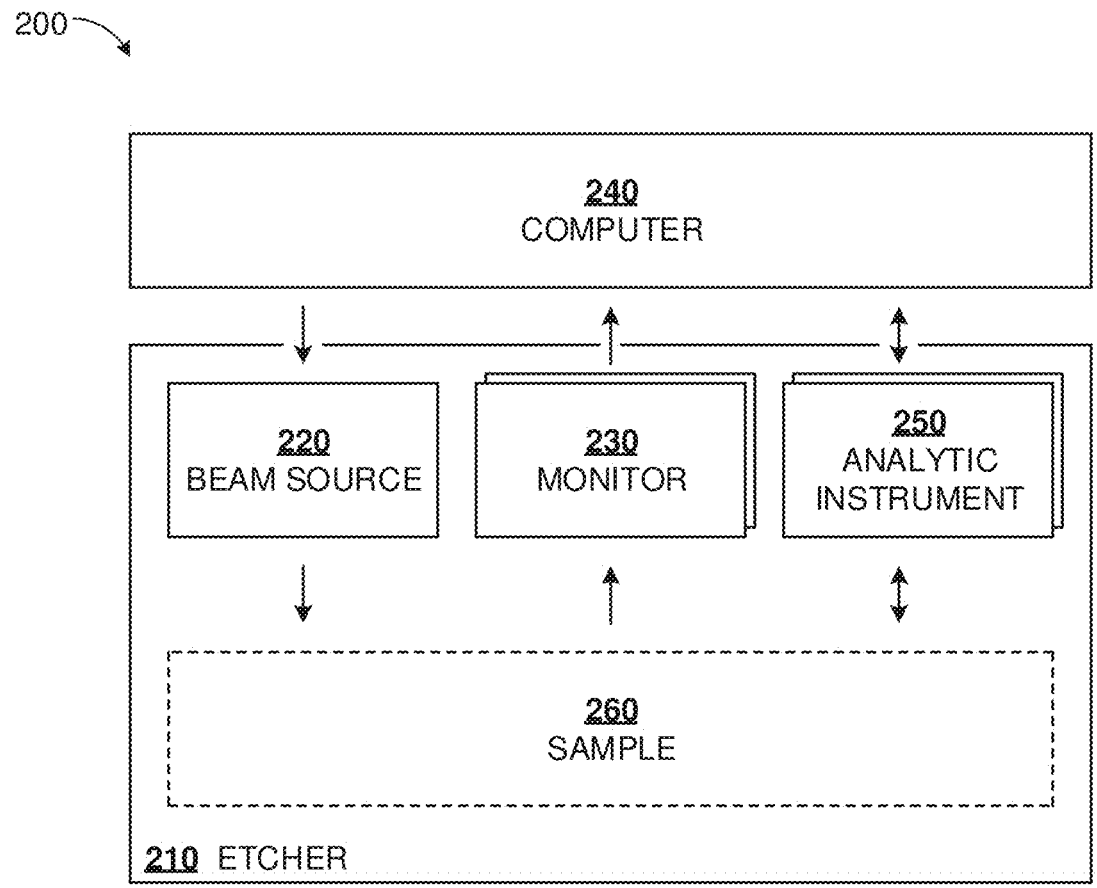
FIG. 2 illustrates an example apparatus according to the disclosed technologies.

FIG. 2 illustrates an example apparatus 200, including an etcher 210 coupled to a computer 240. The apparatus 200 can perform delayering or analysis operations on a sample 260, which can be placed within or proximate to the etcher 210, but which is not part of the apparatus 200. Apparatus 200 or a similar apparatus can perform any one or more of the methods described herein.

In some examples, etcher 210 can include a beam source 220, such as a FIB source, to generate a beam for etching the sample 260. The etching operations can be milling or delayering operations. The beam source 220 can be controlled by the computer 240 as indicated. In other examples, the beam source 220 can generate an electron beam or a laser beam. In further examples, another etching technology can be used, and a different source of etchant or etch energy can be used in place of, or in addition to, beam source 220.

An etching action can be monitored by a monitor 230, which can be a current detector, an imager, or other diagnostic instrumentation. The current can be substrate current measured from sample 260, or scattered or secondary charged particles emitted from the surface of sample 260. An imager can form an image from scattered or secondary charged particles during a raster scan of a milling beam, or with a scanning electron microscope, or with an optical camera (which can operate in the ultraviolet, visible, or infrared portions of the electromagnetic spectrum). In other examples, monitor 230 can measure: gas constituents in an environment above the sample; acoustic emission; or reflected light from a surface of sample 260. In varying examples, the monitor 230 can be configured to acquire a monitoring signal during an etching action; during a pause after an etching action; or in between etching actions. Etcher 210 can include multiple monitors 230, which can employ different measurement techniques (e.g. one imager and one current sensor), or the same measurement technique at different spatial locations.

In some examples, etcher 210 can include one or more analytic instruments 250 for performing analysis on the sample 260. Analytic instruments 250 can include a SEM or an optical camera, however other analytic instruments such as nanoprobers can also be incorporated into etcher 210. In other examples, analytic instruments can be provided as an adjunct to the etcher 210, and can be controlled by computer 240, or independently. Some analytic instruments 250 can be operational during an etching action, while other instruments 250 can be operated after completion of an etching action or in between etching actions.

Second Example Method

Figure 3:
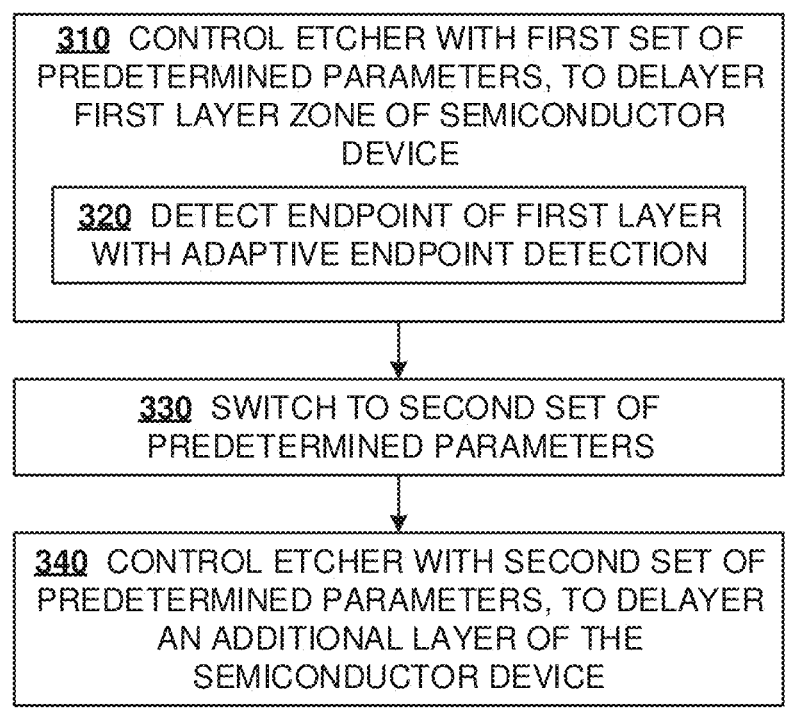
FIG. 3 is a flowchart of a second example method for delayering zones of a semiconductor device, according to the disclosed technologies.

FIG. 3 is a flowchart 300 of a second example method for delayering zones of a semiconductor device. In this method, a set of predetermined parameters is changed after delayering a first zone.

At process block 310, an etcher can be controlled with a first set of predetermined parameters to delayer a first layer zone of a semiconductor device. Within block 310, adaptive endpoint detection can be used at block 320 to detect the endpoint of a first layer within the first layer zone. After completion of block 310, the method advances to block 330, where the first set of predetermined parameters can be replaced by a second set of predetermined parameters, having at least one or more parameters distinct from the first set of predetermined parameters. In some examples, the distinct parameter can be an adaptive endpoint detection parameter, while in further examples, the distinct parameter can be a beam etch parameter. At process block 340, the etcher can be controlled with the second set of predetermined parameters to etch at least one additional layer of the semiconductor device.

Third Example Method

Figure 4:
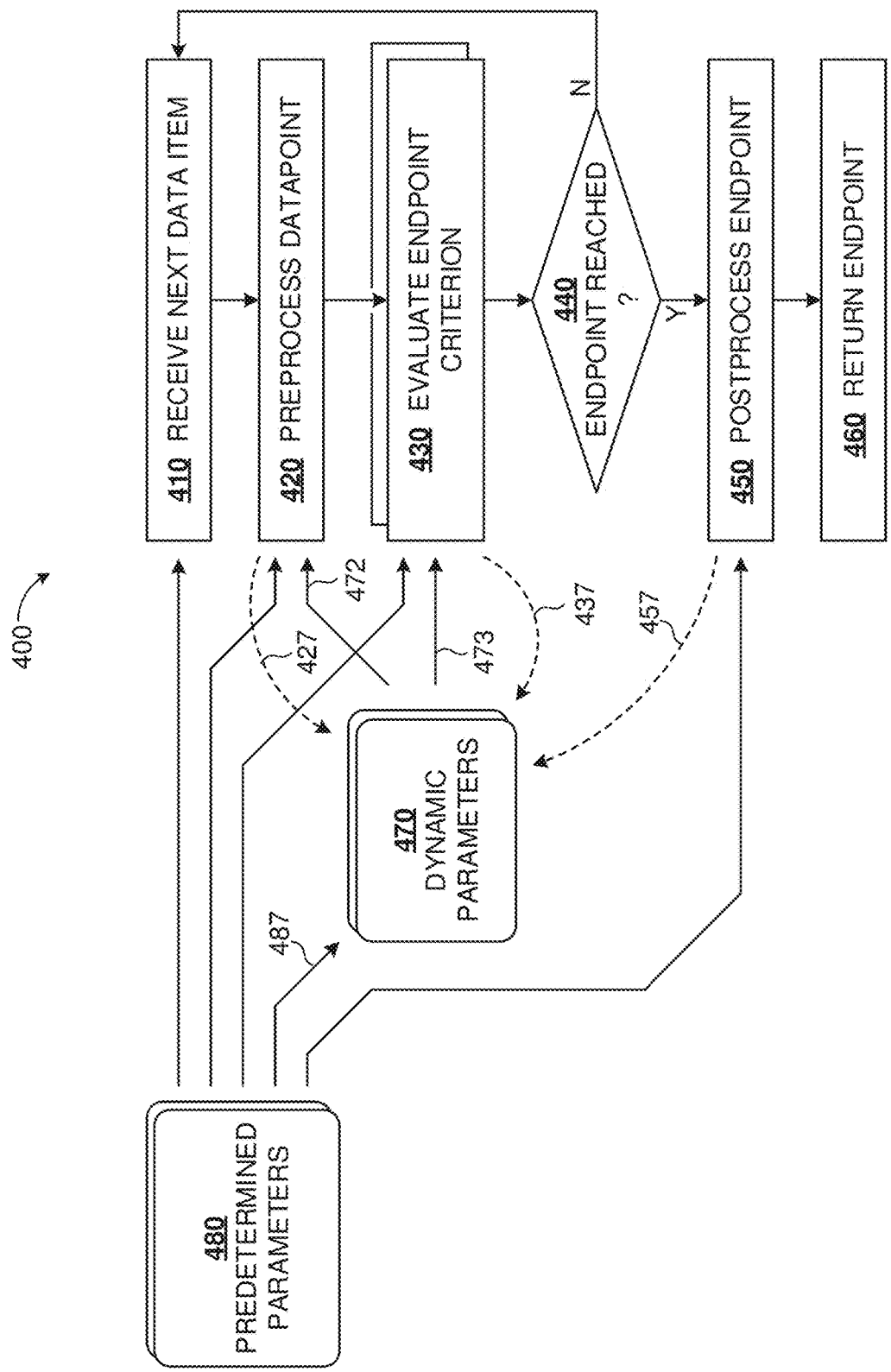
FIG. 4 is a flowchart of a third example method, for adaptive endpoint detection according to the disclosed technologies.

FIG. 4 is a flowchart 400 of an example method for adaptive endpoint detection. This method uses a combination of predetermined parameters 480 and dynamic parameters 470 to determine an endpoint from a sequence of datapoints. Solid line arrows indicate exemplary pathways for the parameters 470, 480 to control the operations of the method, while dashed line arrows indicate exemplary pathways whereby dynamic parameters can be adjusted from the various process blocks. As indicated by arrow 487, dynamic parameters 470 can also receive initialization values from the predetermined parameters 480. Because a predetermined parameter 480 can remain unchanged during a delayering procedure, FIG. 4 has no arrows leading to the predetermined parameters 480.

At process block 410, a next data item can be received. The new data item can correspond to a monitoring signal and can be a scalar quantity, such as a current measurement or an image grayscale value, or a more complex item such as an entire image frame. The rate of acquiring datapoints can be controlled by a predetermined parameter 480.

At process block 420, the new data item can be preprocessed. Preprocessing operations can include validation, filtering, or scaling. Preprocessing can also include extraction of an image parameter from image data received at block 410. Any of these preprocessing operations can be controlled by respective predetermined parameters 480. However in some examples, preprocessing can also depend on a dynamic parameter 470 as shown by arrow 472. For example, a filter time constant can be controlled dynamically based on the amount of noise observed in a monitoring signal (data item). Additionally, the preprocessing can cause adjustment of one or more dynamic parameters, as indicated by arrow 427. For example, preprocessing block 420 can update the standard deviation or noise of a monitoring signal, which can be a dynamic parameter 470, or which can control a filter coefficient or another dynamic parameter 470.

At process block 430, one or more endpoint criteria can be evaluated. Evaluation of an endpoint criterion can be dependent on both predetermined parameters 480 and dynamic parameters 470 (the latter indicated by arrow 473), as described further herein. Further, the method can include multiple endpoint criteria, and selection of which criterion to evaluate can be dependent on predetermined parameters (e.g. different criteria for current or image grayscale monitoring signals) or dynamic parameters (e.g. different criteria if the next sought endpoint is a Peak or a Trough). Additionally, evaluation of endpoint criteria can feed back to update dynamic parameters as indicated by arrow 437. For example, identification of a higher Peak than a prior Peak endpoint can cause a baseline for Trough detection to be updated, as described further herein in the context of FIG. 8B. Examples of peaks 911, 921, 1011-1014 and troughs 912, 922, 1021-1024 are provided in FIGS. 9-10.

At branch block 440, the method proceeds according to whether block 430 resulted in identification of an endpoint. If no endpoint was found, the method can proceed via the N branch of block 440 to block 410 to acquire the next data item. However, if an endpoint was reached, the method can follow the Y branch to block 450, where postprocessing can be performed based on the endpoint. Postprocessing can include performance of analytic tasks at specific layers, as indicated by predetermined parameters 480 of a delayering plan, as described further in context of FIG. 6B herein. Postprocessing can also include calculation or update of delayering milestones based on reached endpoints, which can in turn cause update of dynamic parameters 470 as indicated by arrow 457. For example, a sequence of time markers of successive endpoints can be used to predict a time at which a next endpoint can be expected. The predicted time can be one of the dynamic parameters 470. As another example, the monitoring signal amplitude of the current endpoint can be used to set a threshold value for the next endpoint.

Finally, at process block 460, values associated with the current endpoint can be returned to a supervisory method. In varying examples, the returned values of the endpoint can include an index of the current endpoint (e.g. "4" for the fourth endpoint of a delayering procedure), a layer of the current endpoint (e.g. "Metal-3"), a value of the monitoring signal at this endpoint, a time position or a depth estimate for the current endpoint, a tolerance indicating a range of time or distance between the actual layer endpoint and the identified endpoint, or a confidence level indicating a likelihood that the determined endpoint is accurate to within a predetermined tolerance.

The illustrated pathways between dynamic parameters 470 and the process blocks of FIG. 4 are exemplary. Other embodiments can have more, fewer, or different pathways than those illustrated.

Fourth Example Method

Figure 5:
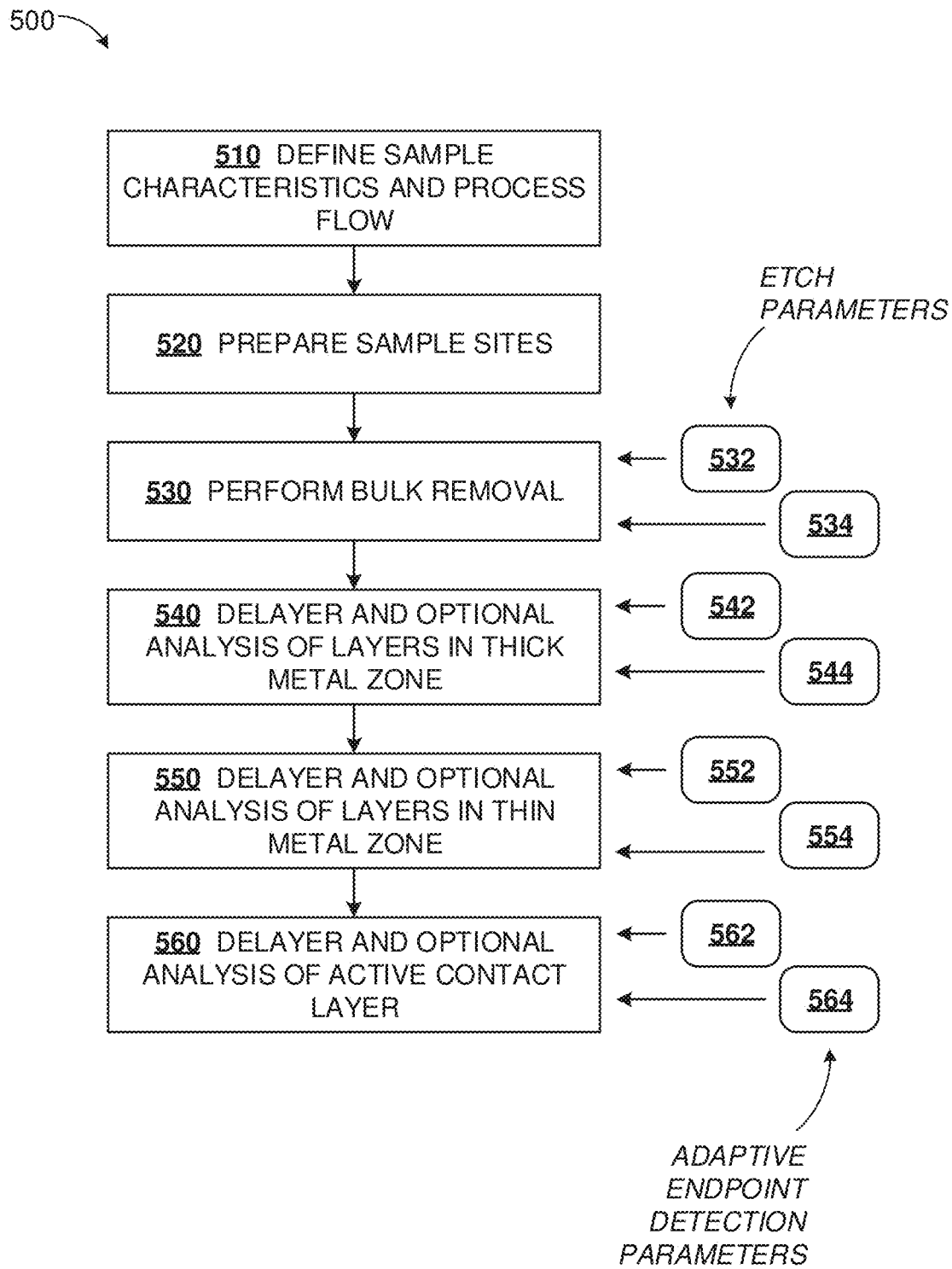
FIG. 5 is a flowchart of a fourth example method for delayering zones of a sample, according to the disclosed technologies.

FIG. 5 is a flowchart 500 of a fourth example method for delayering zones of a sample. This method includes actions performed before and during a delayering procedure.

Figures 6A, 6B:
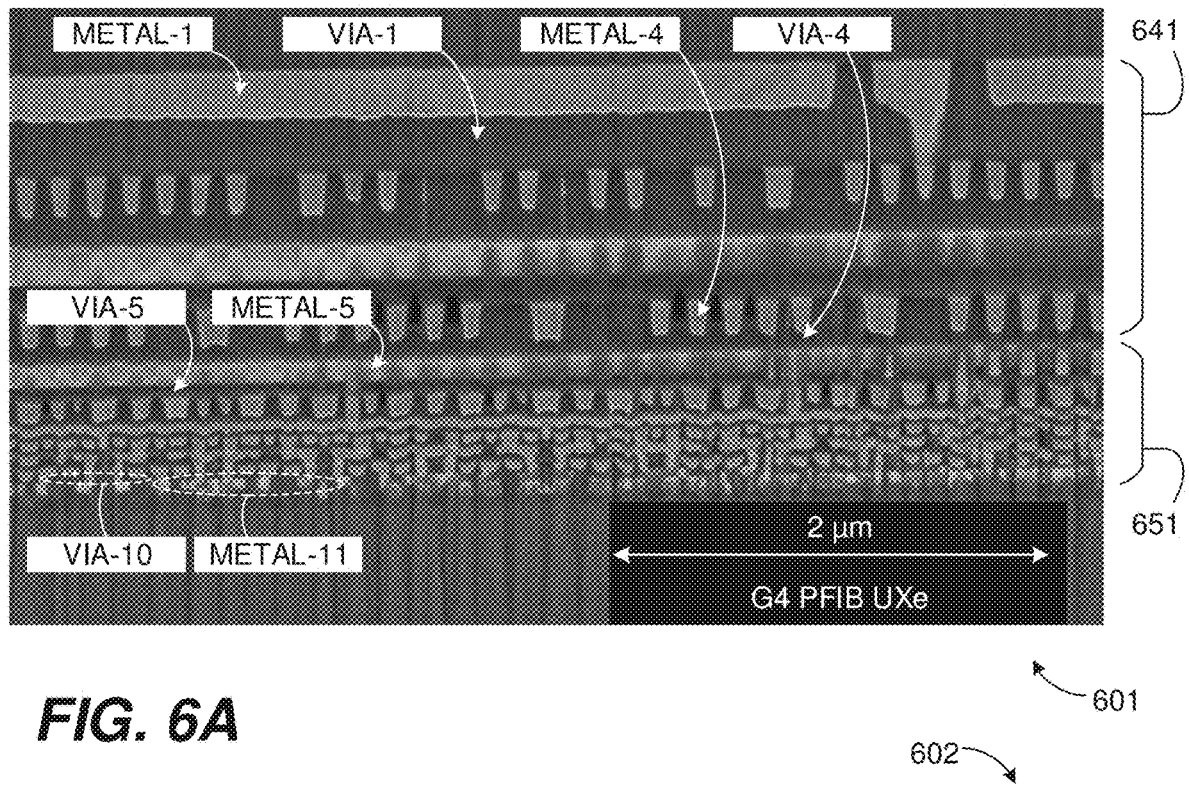
FIG. 6A is a photomicrograph of a cross-section of a sample semiconductor device.
FIG. 6B is a table of example configuration parameters for delayering the sample of FIG. 6A.
Figure 10A:
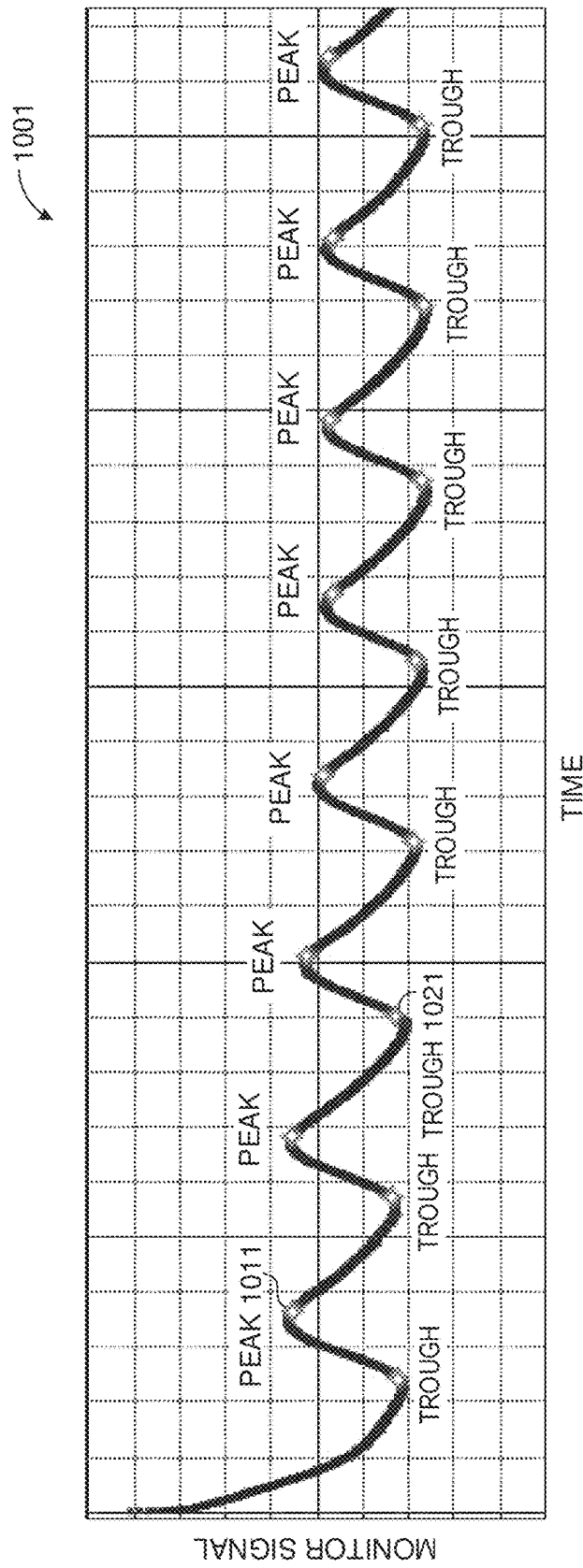
FIGS. 10A-10D are graphs of additional monitor signals which can be used in delayering according to some examples of the disclosed technologies.
Figure 10B:
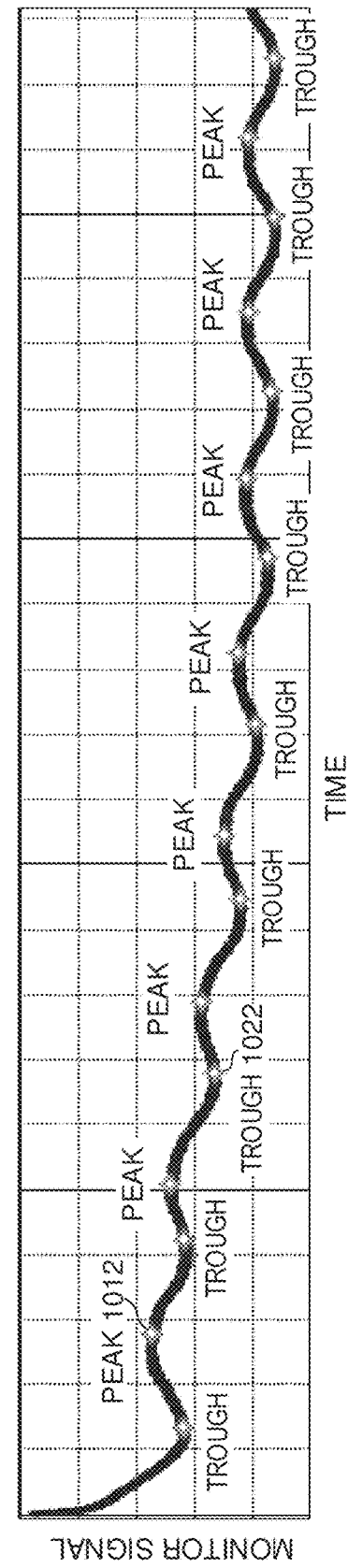
Figure 10C:
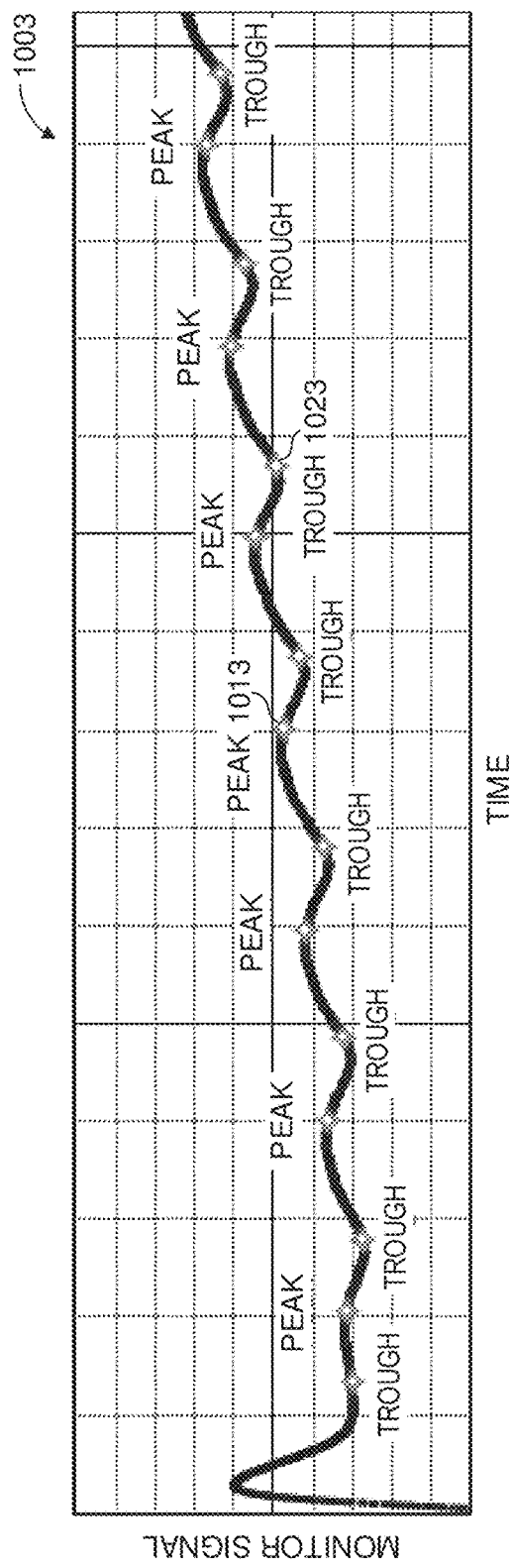
Figure 10D:
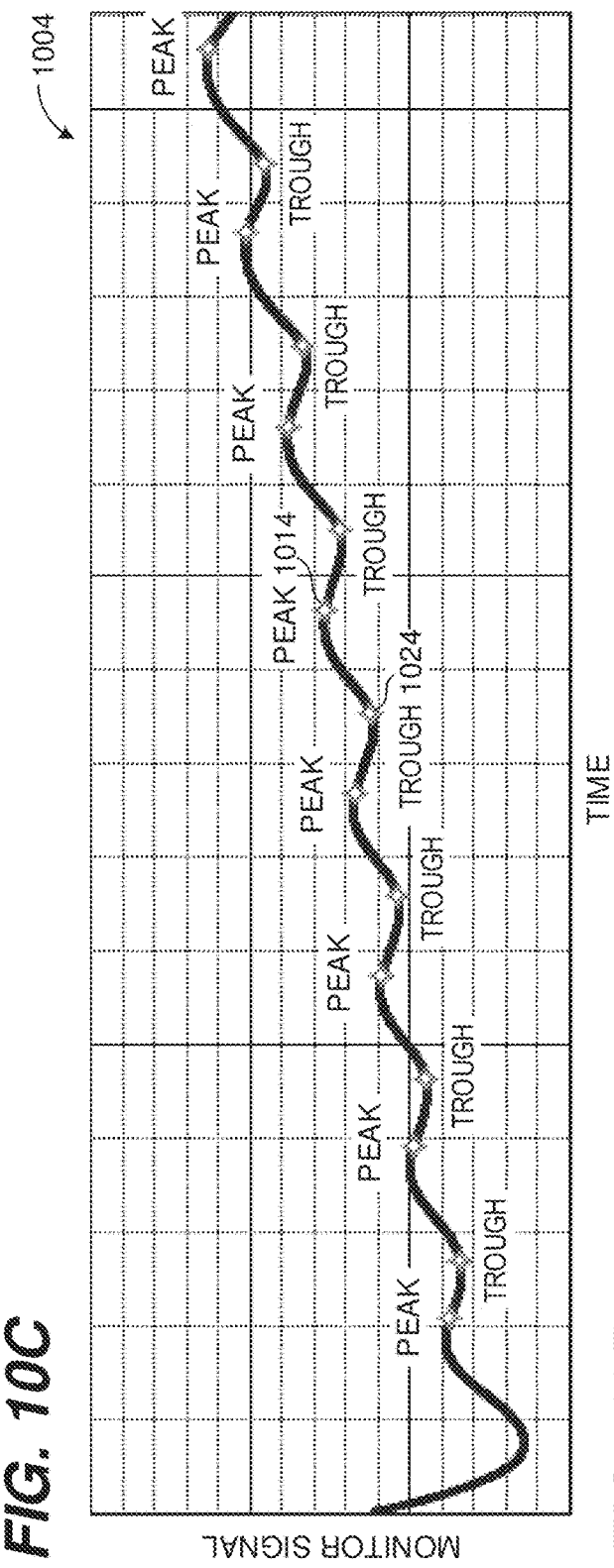

At process block 510, sample characteristics and process flow can be defined. FIGS. 6A-6B provide an illustration. FIG. 6A is a SEM microphotograph 601 of a cross-section of a sample semiconductor device. As indicated by the legend, this image was obtained on a dual beam microscope, which combines a PFIB source with an SEM. The image 601 shows metal as a light gray shade against a dark gray background for insulating material. Counting from the top, zone 641 includes the uppermost four metal layers, Metal-1 through Metal-4 and intervening layers Via-1 through Via-3. Zone 651 includes the remaining metal layers Metal-5 through Metal-11, intervening layers Via-5 through Via-10, as well as layer Via-4 between Metal-4 and Metal-5. In this illustration, layers Metal-1 through Metal-4 have thickness on the order of 100 nm, or in a range 50 nm to 500 nm inclusive, and can be termed "thick" metal layers, while layers Metal-5 through Metal-11 have thickness on the order of 20 nm, or in a range 5 nm to 50 nm, and can be termed "thin" metal layers. These thicknesses are merely illustrative, as layer metal thicknesses can vary considerably between products, product classes, and processes.

FIG. 6B is a table 602 of example configuration parameters for the sample of FIG. 6A, organized as blocks 0-3. Sample characteristics are provided at block 0 "Sample Information," including the stack height of 11 metal layers and the number of thick metal layers as four (Metal-1 through Metal-4 in zone 641). Site information is provided at block 1. To illustrate, the 4$^{th}$ site in an arithmetic and logic unit of a processor device can be named "ALU_04," and a storage folder for configuration, monitoring, or analysis data at this site can be provided as "C:\SAMPLE\". Block 2 can provide various user options for the delayering procedure. Item 2.1, "METAL_METAL," indicates a particular process flow for delayering layers in pairs, each pair being a metal layer followed by a via layer, with optional pauses when each metal layer is reached for imaging analysis. Items 2.2 and 2.3 prescribe a range of layers at which the analysis (imaging) is to be performed, which are layers Metal-3 through Metal-6 in this illustration. Item 2.4 indicates that delayering down to the active contact layer is desired. The milling area 50 µm×50 µm is specified in item 2.5. Finally, item 2.6 indicates that no polishing is to be performed at the imaging endpoints. Polishing can be optionally performed as a preparation for analysis with a probe, using sputtering with a bare beam, e.g. a FIB unassisted by etching gas chemistry. At block 3, item 3.1 indicates that a recovery flag is false. A recovery flag can be set to true to indicate that a site is being reprocessed, e.g. to recover and resume delayering or analysis after failure of a prior procedure at the site.

Returning to flowchart 500, with sample characterized and process flow defined, the method proceeds to block 520. One or more sites can be prepared on the sample. Fiducials can be applied on a surface of the sample device to demarcate etching sites. In some examples, the prepared sample can be installed in the etcher. In an etching apparatus using a translation stage to position successive sites of the sample beneath the working area of an etching beam, the stage locations for one or more sites can be bookmarked to facilitate repositioning of the sample. The etcher can be activated for etching.

At process block 530, bulk removal can be performed, which can include removal of sealant or cap layers above the Metal-1 layer. In some examples, bulk removal can be performed within the same etcher as the delayering, while in other examples, the bulk removal can be performed in a wet etcher prior to placing the sample in the delayering etcher. Within the delayering etcher, bulk removal can also be used to remove any excess remaining surface materials and can also be used to delayer a continuous zone of thick and/or thin metal layers up to the starting layer (item 2.2 in table 602). Bulk removal can be controlled by beam or other etching parameters 532. An endpoint for the bulk removal can also be determined by adaptive endpoint detection, and can be controlled by corresponding predetermined parameters 534. In varying examples, the bulk removal process can end at a prescribed depth in the sample, which can be above layer Metal-1; when layer Metal-1 is reached; or when the starting layer is reached. In examples where the starting layer is in the (lower) thin metal zone 651, process block 530 can count off the layers and switch from thick to thin metal predetermined parameters when transitioning from zone 641 to zone 651.

At process block 540, delayering of a thick metal zone (such as zone 641) can be performed, controlled by etch parameters 542 and adaptive endpoint detection parameters 544. At process block 550, delayering of a thin metal zone (such as zone 651) can be performed, controlled by etch parameters 552 and adaptive endpoint detection parameters 554. Finally, at process block 560, delayering can continue from the end layer (stop point) indicated by (item 2.3 in table 602) until an endpoint indicating that the (top of) the active contact layer has been reached. In some examples, successive layers of a zone of layers can be removed continuously from the end layer (stop point) until the active contact layer is reached. This endpoint can be at a trough following the last metal layer, e.g. Via-11 after Metal-11, with reference to FIG. 6A. Process block 560 can be controlled by etch parameters 562 and adaptive endpoint detection parameters 564.

Any of the delayering blocks 530, 540, 550, 560 can be paused at endpoints defined in the process flow at block 510. Following the illustration of FIG. 6B, imaging can be performed at layers Metal-3 and Metal-4 in zone 641, and at layers Metal-5 and Metal-6 in zone 651.

The etch parameters 532, 542, 552, or 562 can be obtained from a library, or can be determined experimentally from one or more trials on a test device. Similarly, adaptive endpoint detection parameters 534, 544, 554, or 564 can be obtained from a library, or can be determined experimentally from one or more trials on a test device. The endpoint detection parameters 534, 544, 554, or 564 can include an initial setting of threshold (for monitoring signal amplitude above or below a baseline), thresholds for detection of peak and trough endpoints, or a time interval between successive monitoring signal data points.

Example Adaptive Endpoint Detection Parameters

FIGS. 7A-7B illustrate example predetermined adaptive endpoint detection parameters, according to the disclosed technologies. FIG. 7A shows a top view 710 of a milling area 712 on a top surface of a sample. Because of slant sides, it can be desirable to exclude edge portions of the milling area from an image intensity used as a monitoring signal. Thus, parameter extraction from the image can be restricted to the area 711 shown in dashed outline. That is, the image field (region of interest) used for evaluating a monitoring signal can be restricted as one or more predetermined parameters. In varying examples, this restricted image field can be specified as the area (e.g. in $m^2$) of area 711, as the dimensions (length×width) of area 711, as the width of the edge portions between the dashed outline of area 711 and the solid outline of milling area 712, or as a ratio of the area of 711 to the area of 712, which can be expressed as a fraction or as a percentage.

FIG. 7B depicts a graph 720 of an exemplary monitoring signal as a delayering procedure crosses a layer (e.g. a metal layer) having a peak in the monitoring signal. FIG. 7B illustrates features 702-705 associated with respective predetermined parameters. Feature 702 illustrates a time interval between datapoints used for adaptive endpoint detection. As described herein, the illustrated datapoints can be smoothed datapoints using a rolling average, and the actual sampling interval of the monitoring signal can be shorter than the interval 702. In varying examples, the interval 702 can be specified as a time (e.g. in seconds), or as a multiple of a raw sampling rate of the monitoring signal. In other examples, the sampling interval of the raw monitoring signal can be longer than interval 702, and interpolation (or, upsampling) can be used to obtain the illustrated datapoints.

Feature 703 indicates an amplitude that is greater than the signal fluctuations to the left of feature 703, and smaller than the actual peak amplitude observed. Feature 703 can be an initial threshold for determining a first peak or a first trough of a multi-layer delayering procedure. In some examples, the amplitude of feature 703 can be used as the threshold for detection of the first endpoint, while in other examples, the amplitude of feature 703 can be a seed for the adaptive endpoint detection procedure, subject to dynamic update (for example, as the noise level of the monitoring signal is discerned after several samples), so that the actual threshold at the time of first endpoint detection can differ from the initialization value 703. In further examples, trough and peak threshold amplitudes can be initialized to distinct values. Any such initialization value can be a predetermined parameter.

Feature 704 illustrates measurement of a signal peak above the level of a preceding signal trough. In some examples, an amplitude 704 above a threshold can cause a peak endpoint to be detected. The peak detection threshold can be specified as a multiple of either the signal variation (i.e. standard deviation of some or all preceding samples) or as a multiple of a preceding peak amplitude (relative to a preceding or intervening trough). Such a multiplier coefficient can be a predetermined parameter for adaptive endpoint detection.

Feature 705 illustrates a drop from a peak, which can be used to set a threshold for the following trough, measured relative to the preceding peak. The trough detection threshold can be specified as a multiple of the preceding peak amplitude (relative to its preceding trough), or as a multiple of the signal variation (i.e. standard deviation of some or all preceding samples).

Feature 706 illustrates an endpoint spacing threshold, which can be used to reduce a risk of false positive endpoints too close to a preceding endpoint. As illustrated, a peak is detected at 704, and a subsequent endpoint can be required to be spaced apart from the peak at 704 by an amount corresponding to the arrow 706. In varying examples, the spacing 706 can be designated in units of time, such as few seconds or minutes, or in units of distance, such as nm or m. In examples, the time spacing can be in a range from 1 s-30 minutes ("min."). An endpoint detection procedure can be turned off after an endpoint is detected until the endpoint spacing threshold, measured from the last endpoint, has passed. This can be advantageous to avoid false triggers on a noisy monitor signal. The duration of such a spacing threshold can be in a range 1-30 s, or 2-20 s, or 5-15 s, or about 10 s. In other examples, the endpoint detection procedure can continue to operate, however a subsequent inflection can be determined not to meet endpoint criteria if its spacing to the previous endpoint is less than the endpoint spacing threshold. This can be advantageous to avoid false triggers from target devices having strong shoulders and deep secondary troughs. The duration of such a spacing threshold can be in a range 30 s-30 min., 1-10 min., 2-5 min., or about 3 min. Corresponding endpoint spacing thresholds can vary from 1 nm to 100 μm. In some layer stacks, the spacing threshold can be in a range 2-100 nm, 5-50 nm, 10-20 nm, or about 15 nm, while in bulk layer removal or other applications, spacing thresholds can be in a range 100 nm-100 μm, 1-50 μm, or 10-20 μm. The endpoint spacing threshold can be specific to particular endpoint types. For example, following a peak endpoint (e.g. Metal 5), a spacing threshold can be applied for a subsequent trough, while allowing detection of subsequent peaks, one of which could displace the first peak endpoint with a stronger second peak (still Metal 5) among a series of peaks. More than one endpoint spacing threshold can be used together. Any such endpoint spacing threshold can be a predetermined parameter.

The described features, predetermined parameters, and representations are illustrative. In varying examples, less, more, or different features or predetermined parameters can be used.

Additional Example Methods

FIGS. 8A-8B are flowcharts 800, 802 of additional example methods for delayering zones of a sample, according to the disclosed technologies. FIG. 8A illustrates processing of monitoring signals and processing of endpoints, while FIG. 8B illustrates flow through an exemplary endpoint detection algorithm. For convenience of description, the methods depicted in flowcharts 800, 802 are termed "method 800" and "method 802" respectively. Connectors, shown as hexagons, are used to represent paths leading to or from various process blocks.

Starting with FIG. 8A, a monitoring datapoint can be received at process block 810. In some examples, the monitoring signal is a current signal, and the monitoring datapoint can be the value of the current signal. That is, the current signal can be received at block 818. In other examples, the monitoring signal can be an image of the sample and the monitoring datapoint can be a parameter obtained from the image. At block 812, an image frame can be received, and at process block 814, a monitoring parameter can be extracted from the image frame. To illustrate, the monitoring parameter can be an average grayscale value over a region of interest within the image frame, however other parameters can also be used. Exemplary monitoring parameters can include: different percentiles of the grayscale distribution of an image area; variation or standard deviation of the grayscale values; a measure of true color or false color from the image area; a change in an image parameter from a preceding image frame; or other parameters. Gamma correction, transforms, or other image processing operations can be applied prior to calculating the monitoring parameter. Although FIG. 8A illustrates acquisition of a datapoint for current and image monitoring signals, these are only illustrative, and other monitoring signals can be used with the disclosed technologies. In further examples, more than one type of monitoring signal can be used simultaneously. Block 810 can be performed repeatedly, to obtain a sequence or monitoring signal values, such as a sequence of current readings or a sequence of image parameters. Detection of an endpoint downstream can be based on such a sequence of monitoring signal values.

Process block 810 can be triggered by a Start trigger 801, or by resuming or continuing from other operations as illustrated in one or more portions of the flowcharts 800, 802 as indicated by flowchart connector 805. In further examples, the input 805 to block 810 can be omitted, and process block 810 can run autonomously once initiated by a Start trigger 801, to acquire a succession of monitoring datapoints during a delayering procedure. Process block 810 can also be controlled by one or more predetermined parameters 881. These parameters can include specification of a monitoring modality (e.g. current or image), and associated parameters (e.g. frequency of acquiring successive monitoring datapoints, a region of interest within an image, or coefficients associated with extraction of an image parameter at block 814).

In some examples, the raw datapoints obtained at process block 810 can be smoothed with a rolling average at process block 820. The rolling average can be a moving average of the last N datapoints, with N being an integer greater than or equal to two. Other finite impulse response filters (e.g. fixed length digital filters) or infinite impulse response filters (e.g. exponential averaging) can also be used at block 820.

Block 820 can output a smoothed datapoint which can be at the same rate as raw datapoints are produced by block 810, or at a different rate. While some examples described herein apply downsampling of monitoring datapoints at block 820, to produce a sequence of smoothed datapoints, this is not a requirement. In other examples, block 820 can interpolate or upsample the monitoring datapoints, or a combination of downsampling and upsampling can be used to obtained smoothed datapoints at a desired rate. Process block 820 can also be controlled by predetermined parameters 883. For example, parameters 883 can control which form of averaging to apply, the length of the average, other filter coefficients, an output data rate, or any upsampling or downsampling to be applied.

At process block 825, the smoothed datapoint produced by block 820 can be evaluated to determine whether an endpoint has been reached. Endpoint evaluation can be performed by triggering method 802, following connector 803 as shown. However this is not a requirement, and method 800 can stand alone employing a different technique to ascertain whether an endpoint has been reached. Example predetermined parameters 891 can control process block 825, and some example parameters are described in context of flowchart 802 herein. When an endpoint is detected, the method can continue at process block 830. In examples where block 825 invokes method 802, method 802 can return with a determined endpoint to process block 830 of method 800, as illustrated by connectors 807. In other examples, the method 800 can follow dashed line from block 825 to block 830 in cases where an endpoint is detected. Some smoothed datapoints, in some cases even a majority of smoothed datapoints, may not result in determination of an endpoint. At process block 830, the current endpoint can be updated in a log or in software associated with the delayering procedure, so as to keep track of delayering progress.

At decision block 835, a determination can be made whether the delayering should be paused at the present endpoint. The stop or pause decision can be controlled by predetermined parameters 885, which can include process flow parameters. A stop decision can be made based on a process flow specification similar to that described in context of FIG. 6B. For example, delayering can be stopped based on: the last layer having been reached (item 0.1 in FIG. 6B); if delayering down to the Active layer is not required (item 2.4); or if the last layer at which imaging or analysis is required has been reached (item 2.3). A pause decision can be made based on whether any analysis is required on the layer reached at the present endpoint (items 2.2, 2.3). If no stop or pause is required, the method 800 can proceed via the N branch from block 835 following connector 805 to resume monitoring of datapoints at block 810. However, if stop or pause is required, the method can follow the Y branch to block 840, where any etching action is stopped or paused, for example by turning off an etching beam.

In cases where a stop condition is reached, method 800 is complete after block 840 has been performed. Any files can be saved, logs can be updated and closed, or an etcher can be controlled to execute a shutdown sequence. However, in other cases where delayering is paused, the method can wait until a Resume control signal is received as a trigger 809, upon which a delayering procedure can be resumed at block

845. In examples, an etching beam can be turned back on, and material removal can recommence. Then, the method 800 can continue, following connector 805 to resume monitoring of datapoints at block 810.

Turning to flowchart 802, a method is presented for receiving a monitoring datapoint (in a succession of monitoring datapoints) and determining whether a next endpoint has been reached. Method 802 can be invoked from block 825 of method 800, and can return a datapoint to block 830. However, this is not a requirement. Method 802 can stand alone, determining endpoints from successive datapoints obtained with other methods.

At decision block 850, a new datapoint can be evaluated to determine whether an inflection point has been reached, i.e. if the new datapoint indicates a signal change in opposite direction to an immediately preceding signal change. Inflection points can be peaks (previous signal change was Up, and new signal change is Down) or troughs (previous signal change was Down, and new signal change is Up). If an inflection point is not present, method 802 proceeds along the N branch from block 850 to connector 805. No further evaluation of the new datapoint is required and, in examples where method 802 is invoked from method 800, method 802 can return, following connector 805, to block 810 of method 800. However, if a peak inflection point is detected, method 802 can follow the P branch from block 850 along the right-hand side of the flowchart, to be described further. If a trough inflection point is detected, method 802 can follow the T branch from process block 850 along the left-hand side of flowchart 802 which is generally similar but mirrors the right-hand side flowchart for the P branch. Process block 850 can also be controlled by predetermined parameters 893. For example, parameters 893 can control hysteresis at block 850, so that signal changes less than a threshold value are considered to be unchanged, and only signal changes at least equal to the threshold value are used for identifying inflection points. Parameters 893 can also control initialization of dynamic values used in method 802. For example, a "last endpoint" type can be initialized to "Trough" to force method 802 to first find a Peak endpoint, which can be a metal layer.

With a Peak (P) inflection determined, method 802 proceeds to block 861, where the present inflection type (P) is compared with the last found endpoint. If the last found inflection was also a Peak, then the new Peak signal value P can be compared with the previous Peak value P_LAST at decision block 863. If the new Peak exceeds the previous Peak value, the Y branch is followed to block 865, and the P_LAST value is ratcheted upward at block 865. The P_LAST value can be used as a reference for determining whether a next Trough inflection meets criteria for the next endpoint, hence updating the P_LAST value can set the reference to the maximum among a group of peaks, irrespective of which of these peaks was actually detected as an endpoint. Regardless of whether P_LAST is updated, the Y branch from block 861 does not correspond to a next endpoint (which can be Trough after the last Peak), and so both blocks 863, 865 proceed to completion of method 802, as shown at connector 805.

However, if the current Peak follows a Trough endpoint, then method 802 follows the N branch from block 861 to decision block 867, where the current Peak inflection point can be evaluated further. The current Peak is evaluated to see if it meets present criteria as the next Peak endpoint. Decision block 867 can incorporate both predetermined parameters 895 and dynamic parameters of an adaptive endpoint determination procedure. As an illustration, the relationship $$(P-T\_LAST) > K0 \times A1 \tag{1}$$

can be evaluated, where P is the peak value of the current inflection point, T_LAST is a trough baseline from a preceding trough (which can be the same as the previous trough value, or can be lower than this value by updates of T_LAST similar to the P_LAST updates at blocks 861, 863), K0 is a predetermined parameter, and A1 is a dynamic amplitude between the immediately preceding Peak and Trough. In further examples, A1 can be a dynamic value equal to the standard deviation of all raw or smoothed datapoints from the commencement of the delayering procedure. If the illustrated relationship is found to be False, then the desired Peak has not yet been found, and method 802 can proceed via the N branch of block 867 to complete, as shown at connector 805. However, if the illustrated relationship evaluates to True, then an endpoint can be determined, and the Y branch of block 867 can be followed to block 869, where the new endpoint can be logged, and a P_LAST value (to be used for detection of a subsequent endpoint) can be initialized to P. With endpoint determined, the method can be complete. In some examples, the endpoint can be provided to method 801, as shown by connector 807.

The left side of flowchart 802 handles a Trough (T) inflection similarly via the T branch of decision block 850. If the T inflection is the same type as the preceding endpoint, then the Y branch of block 871 leads to blocks 873, 875, where T_LAST is set to min(T, T_LAST) and the method completes. However, if the T inflection follows a Peak endpoint, then the N branch from block 871 leads to block 877 for further evaluation. If the new T inflection meets criteria (based on a combination of predetermined parameters 897 and dynamic parameters), then a new endpoint is found and T_LAST is initialized to T via the Y branch from block 877. Testing endpoint criteria can include evaluation of relationships similar to Equation (1). Method 802 completes, as shown by connector 807, returning the new endpoint to block 830 of method 800 in some examples. If criteria for a desired Trough endpoint are not met, method 802 completes via the N branch of block 877, as shown at connector 805.

The dynamic parameters P_LAST, T_LAST, A1 described above indicate how the method can adapt to the waveform of a monitoring signal, however these parameter are only examples, and other adaptive parameters can also be used. Additionally, in further examples, P_LAST, T_LAST, A1 can be omitted, and a non-adaptive variation of method 802 can be used, with or without method 800.

Example Performance Results

FIGS. 9A-9B are graphs 901, 902 of example monitor signals obtained during delayering two sites on a common semiconductor device sample, according to the disclosed technologies. The graphs 901, 902 show stage current from the sample as a function of time during a delayering procedure according to the disclosed technologies. The horizontal time axis can serve as a proxy for etching depth. The vertical current axis is correlated with material type, such that etching metal provides larger current than etching an electrically insulating material. Zones 904, 905 are common across the respective sites of graphs 901, 902, and can be thick-metal and thin-metal zones respectively.

Each graph 901, 902 shows a succession of peaks 911, 921 as determined by disclosed techniques and marked with upward pointing triangles (A). Intervening troughs 912, 922, also determined using disclosed techniques, are also shown, marked with downward pointing triangles (V). In the illustrated device, the peaks are characterized by leading shoulders (detected as desired endpoint peaks) or trailing shoulders 913, 923. Such shoulders can arise from encapsulation or other coating layers present at interfaces between metal and via layers. The substantial variations in shape or amplitude of such shoulders offering ample opportunity for false peaks 913, 923 or false troughs 914, 924 to be determined. In addition to shape artifacts, the graphs 901, 902 show significant differences in e.g. peak amplitudes in zone 904. Yet in spite of these artifacts and variability, the disclosed technologies can reliably determine peaks 911, 921 and troughs 912, 922, with the same predetermined parameters used at both sites.

FIGS. 10A-10D are graphs 1001-1004 of additional monitor signals which can be handled by the disclosed technologies. The graphs 1001-1004 show monitor signal amplitude vs time for delayering procedures on respective sample devices, and validate the disclosed technologies across a range of devices having diverse signal waveforms, amplitudes, initial signal shapes, and signal drift. Peaks 1011-1014 (labeled "Peak") and troughs 1021-1024 (labeled "Trough") are illustrated, as determined by automated endpoint detection using predetermined parameters.

A Generalized Computer Environment

Figure 11:
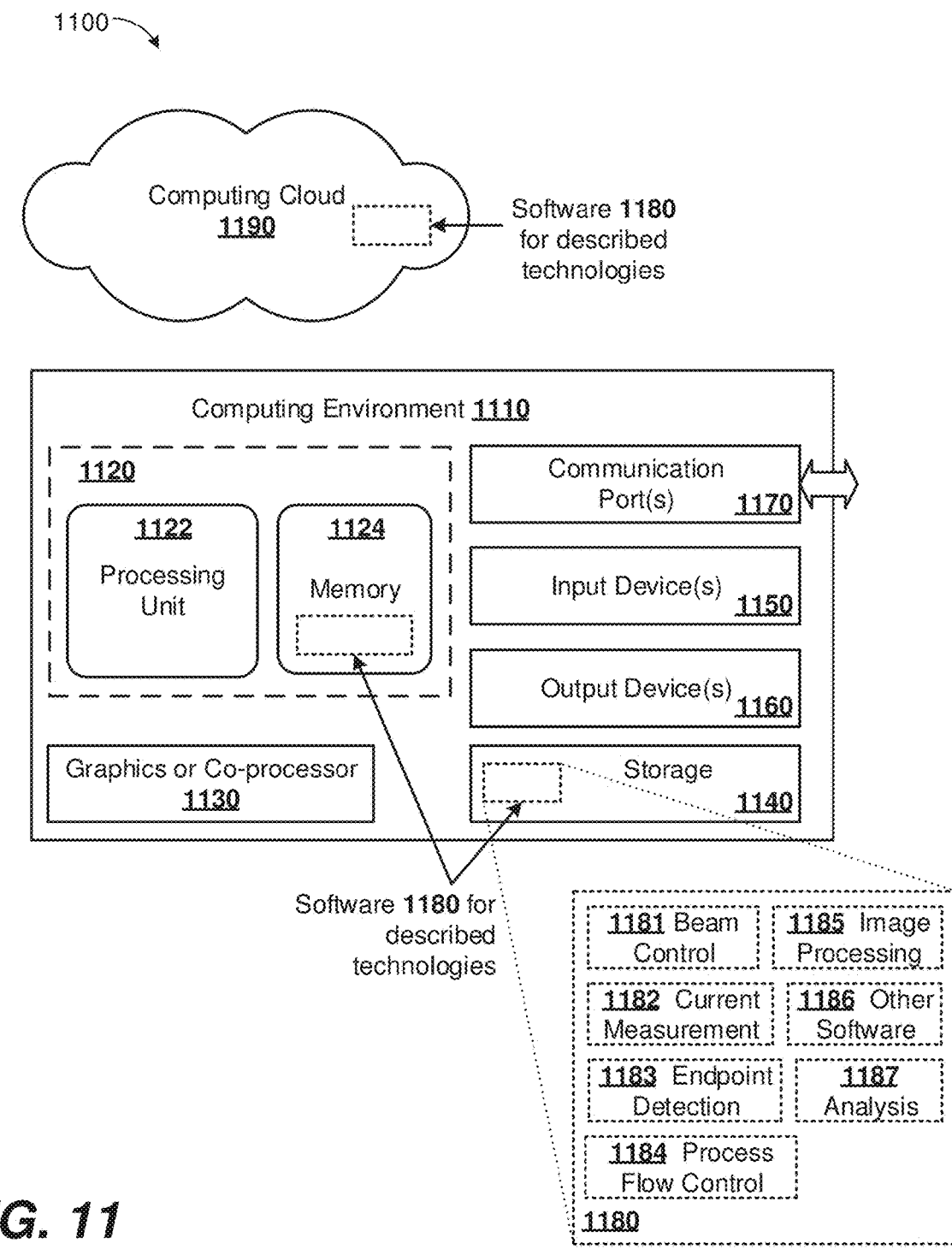
FIG. 11 illustrates a generalized example of a suitable computing environment in which described embodiments, techniques, and technologies pertaining to disclosed delayering methods and apparatus can be implemented.

FIG. 11 illustrates a generalized example of a suitable computing system 1100 in which described examples, techniques, and technologies for sample preparation, with e.g. a focused particle beam or adaptive endpoint detection, can be implemented. The computing system 1100 is not intended to suggest any limitation as to scope of use or functionality of the present disclosure, as the innovations can be implemented in diverse general-purpose or special-purpose computing systems. The computing system 1100 can control a sample preparation system, including an etching tool, an ion milling machine, a gas flow or pumping system, valves, a load lock, a sample handling system, or associated instrumentation; or can acquire, process, output, or store configuration or measurement data.

With reference to FIG. 11, computing environment 1110 includes one or more processing units 1122 and memory 1124. In FIG. 11, this basic configuration 1120 is included within a dashed line. Processing unit 1122 can execute computer-executable instructions, such as for control or data acquisition as described herein. Processing unit 1122 can be a general-purpose central processing unit (CPU), a processor in an application-specific integrated circuit (ASIC), or any other type of processor. In a multi-processing system, multiple processing units execute computer-executable instructions to increase processing power. Computing environment 1110 can also include a graphics processing unit or co-processing unit 1130. Tangible memory 1124 can be volatile memory (e.g., registers, cache, or RAM), non-volatile memory (e.g., ROM, EEPROM, or flash memory), or some combination thereof, accessible by processing units 1122, 1130. The memory 1124 stores software 1180 implementing one or more innovations described herein, in the form of computer-executable instructions suitable for execution by the processing unit(s) 1122, 1130. For example, software 1180 can include software 1181 for controlling an etching beam (including automated endpoint detection and integrated analysis), software 1182 for controlling current measurement, software 1183 for automated endpoint detection, software for process flow control 1184, software for processing images 1185, analysis software 1187, or other software 1186. The inset shown for software 1180 in storage 1140 can be equally applicable to software 1180 elsewhere in FIG. 11. The memory 1124 can also store control parameters, calibration data, measurement data, or database data. The memory 1124 can also store configuration and operational data.

A computing system 1110 can have additional features, such as one or more of storage 1140, input devices 1150, output devices 1160, or communication ports 1170. An interconnection mechanism (not shown) such as a bus, controller, or network interconnects the components of the computing environment 1110. Typically, operating system software (not shown) provides an operating environment for other software executing in the computing environment 1110, and coordinates activities of the components of the computing environment 1110.

The tangible storage 1140 can be removable or non-removable, and includes magnetic disks, magnetic tapes or cassettes, CD-ROMs, DVDs, or any other medium which can be used to store information in a non-transitory way and which can be accessed within the computing environment 1110. The storage 1140 stores instructions of the software 1180 (including instructions and/or data) implementing one or more innovations described herein. Storage 1140 can also store image data, measurement data, reference data, calibration data, configuration data, or other databases or data structures described herein.

The input device(s) 1150 can be a mechanical, touch-sensing, or proximity-sensing input device such as a keyboard, mouse, pen, touchscreen, or trackball, a voice input device, a scanning device, or another device that provides input to the computing environment 1110. The output device(s) 1160 can be a display, printer, speaker, optical disk writer, or another device that provides output from the computing environment 1110. Input or output can also be communicated to/from a remote device over a network connection, via communication port(s) 1170.

The communication port(s) 1170 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

A data acquisition system can be integrated into computing environment 1110, either as an input device 1150 or coupled to a communication port 1170, and can include analog-to-digital converters or connections to an instrumentation bus. An instrumentation control system can be integrated into computing environment 1110, either as an output device 1160 or coupled to a communication port 1170, and can include digital-to-analog converters, switches, or connections to an instrumentation bus.

In some examples, computer system 1100 can also include a computing cloud 1190 in which instructions implementing all or a portion of the disclosed technology are executed. Any combination of memory 1124, storage 1140, and computing cloud 1190 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

GENERAL CONSIDERATIONS

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. Furthermore, as used herein, the terms "or" and "and/or" mean any one item or combination of items in the phrase.

The systems, methods, and apparatus described herein should not be construed as limiting in any way. Instead, the present disclosure is directed toward all novel and nonobvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. The technologies from any example can be combined with the technologies described in any one or more of the other examples. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "average," "control," "detect," "determine," "extract," "filter," "invoke," "pause," "produce," "provide," "resume," "switch," "trigger," or "wait" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest," "best," "minimum," or the like. It will be appreciated that such descriptions are intended to indicate that a selection among a few or among many alternatives can be made, and such selections need not be lower, better, less, or otherwise preferable to other alternatives not considered.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Any of the disclosed methods can be controlled by, or implemented as, computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 11, computer-readable storage media include memory 1124, and storage 1140. The term computer-readable storage media does not include signals and carrier waves. In addition, the term computer-readable storage media does not include communication ports (e.g., 1170).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Adobe Flash, C, C++, C#, Curl, Dart, Fortran, Java, JavaScript, Julia, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, side-loaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope and spirit of these claims.

We claim:

1. An apparatus comprising:
   an etcher;
   computer-readable media storing instructions; and
   one or more hardware processors with memory coupled thereto, the one or more hardware processors further coupled to the etcher and the computer-readable media;
   wherein the instructions, when executed by the one or more hardware processors, cause the apparatus to:
   delayer at least first and second layers of a sample with respective sets of predetermined beam etch parameters;
   adaptively detect respective endpoints at the first and second layers using respective sets of predetermined adaptive endpoint detection parameters; and
   pause or halt delayering when a predetermined target layer of the sample is reached;
   wherein the first and second layers are associated with distinct sets of the predetermined beam etch parameters, or the first and second layers are associated with distinct sets of the adaptive endpoint detection parameters.

2. The apparatus of claim 1, wherein a common set of the predetermined beam etch parameters is used for the controlling the delayering of a contiguous group of layers of the sample, and a common set of the adaptive endpoint detection parameters is used for detecting the respective endpoints of the contiguous group of layers.

3. The apparatus of claim 1, wherein the first and second layers are metal layers, and a thickness of the first layer is at least twice a thickness of the second layer.

4. The apparatus of claim 1, wherein the detecting of the respective endpoints of the first and second layers is performed with distinct values for at least one of the adaptive endpoint detection parameters.

5. The apparatus of claim 4, wherein the at least one of the adaptive endpoint detection parameters having the distinct values includes one or more of: an initial value of an endpoint detection threshold; a coefficient for dynamically updating the endpoint detection threshold; an endpoint spacing threshold; or a parameter characterizing a region of interest in an image of the sample.

6. The apparatus of claim 1, wherein the delayering of the first and second layers is performed with distinct values for at least one of the beam etch parameters.

7. The apparatus of claim 6, wherein the at least one of the beam etch parameters having the distinct values comprises one or more of: a voltage, a current, a focus diameter, an etching area, a dwell time, a scanning speed, or a rastering pitch.

8. The apparatus of claim 1, wherein the apparatus is further configured to:
   resume the delayering upon receipt of a control signal indicating completion of an analytic procedure on the sample at the target layer.

9. The apparatus of claim 1, wherein the delayering is performed at first and second sites of the sample, wherein the sets of the predetermined beam etch parameters and the sets of the predetermined adaptive endpoint detection parameters are identical for the delayering at the first and second sites.

10. The apparatus of claim 1, further comprising a monitor configured to receive a signal indicating a measure of electrical current from the sample;
    wherein the adaptively detecting is based on the signal.

11. The apparatus of claim 1, further comprising a monitor configured to obtain a sequence of image parameters of respective images of the sample;
    the adaptively detecting is based on the sequence of image parameters.

12. The apparatus of claim 1, wherein a given one of the endpoints is determined as a peak in a monitoring signal from the sample during the delayering.

13. The apparatus of claim 12, wherein another one of the endpoints is determined as a trough in the monitoring signal.

14. The apparatus of claim 1, wherein the etcher is configured to generate a focused ion beam (FIB).

15. The apparatus of claim 14, wherein the apparatus further comprises a scanning electron microscope (SEM).

16. A method comprising:
    controlling delayering of successive layers of a semiconductor device with respective sets of predetermined parameters, wherein the semiconductor device is a logic device and the successive layers comprise an alternating stack of metal layers and via layers, and an active layer, the metal layers being a metal layer type and the via layers being a via layer type; and
    determining endpoints of the successive layers using adaptive endpoint detection;
    wherein the successive layers comprise first and second layers of a given layer type, among the metal layer type and the via layer type, and the delayering of the first and second layers is respectively controlled by distinct sets of the predetermined parameters.

17. The method of claim 16, wherein the semiconductor device is a first semiconductor device and the method further comprises:
    determining adaptive endpoint detection parameters of the predetermined parameters, prior to the delayering, from one or more trials on a second semiconductor device.

18. The method of claim 16, wherein:
    the alternating stack comprises a first group of layers above a second group of layers; and
    the metal layers of the first group, including the first layer, have a first minimum thickness greater than a second maximum thickness of the metal layers of the second group, which include the second layer.

19. The method of claim 16, wherein the determining of a given one of the endpoints comprises identifying a trough in a monitoring signal from the semiconductor device during the delayering.

20. One or more computer-readable storage media storing instructions which, when executed by one or more hardware processors, cause the one or more hardware processors to perform operations comprising:
- controlling an etcher, using a first set of predetermined parameters, to delayer a first zone of a semiconductor device, the first zone comprising two or more contiguous layers of the semiconductor device;
- determining an endpoint of a first layer of the first zone using adaptive endpoint detection;
- subsequent to the delayering of the first zone, switching to a second set of predetermined parameters distinct from the first set; and
- controlling the etcher, using the second set of predetermined parameters, to delayer at least one additional layer of the semiconductor device.

* * * * *